United States Patent
Belin et al.

(10) Patent No.: US 10,935,612 B2
(45) Date of Patent: Mar. 2, 2021

(54) CURRENT SENSOR HAVING MULTIPLE SENSITIVITY RANGES

(71) Applicants: Allegro MicroSystems, LLC, Manchester, NH (US); Commissariat à l'énergie atomique et aux énergies alternatives, Paris (FR)

(72) Inventors: Noémie Belin, Villejuif (FR); Shaun D. Milano, Dunbarton, NH (US); Wade Bussing, Manchester, NH (US); Claude Fermon, Orsay (FR)

(73) Assignees: Allegro MicroSystems, LLC, Manchester, NH (US); Commissariat à l'énergie atomique et aux énergies alternatives, Paris (FR)

( * ) Notice: Subject to any disclaimer, the term of this patent is extended or adjusted under 35 U.S.C. 154(b) by 184 days.

(21) Appl. No.: 15/999,448

(22) Filed: Aug. 20, 2018

(65) Prior Publication Data
US 2020/0057120 A1 Feb. 20, 2020

(51) Int. Cl.
*G01R 15/20* (2006.01)
*G01R 19/00* (2006.01)
(Continued)

(52) U.S. Cl.
CPC ......... *G01R 33/093* (2013.01); *G01R 33/096* (2013.01); *G01R 33/098* (2013.01)

(58) Field of Classification Search
CPC .... G01R 15/20; G01R 15/202; G01R 15/205; G01R 15/207; G01R 19/00; G01R 33/025; G01R 33/07; G01R 33/09
See application file for complete search history.

(56) References Cited

U.S. PATENT DOCUMENTS 4,283,643 A 8/1981 Levin
4,343,026 A 8/1982 Griffith et al.
(Continued)

FOREIGN PATENT DOCUMENTS

CH 683469 A5 3/1994
DE 3133908 A1 7/1982
(Continued)

OTHER PUBLICATIONS

Search Report and Written Opinion dated Dec. 3, 2019 for PCT Application No. PCT/US2019/042921; 15 pages.
(Continued)

*Primary Examiner* — Neel D Shah
(74) *Attorney, Agent, or Firm* — Daly, Crowley, Mofford & Durkee, LLP

(57) ABSTRACT

Systems and methods described herein provide a current sensor based on magnetic field detection having multiple sensor arrangements with multiple, different sensitivity ranges. The outputs of the multiple sensor arrangements can be combined to generate a single output signal. The current sensor can include two or more sensor arrangements, each having one or more magnetic field sensing elements, and configured to sense a magnetic field in different first measurement ranges corresponding to different ranges of currents through the conductor and further configured to generate different magnetic field signals indicative of the sensed magnetic field in the respective measurement range. The current sensor can include a circuit configured to generate an output signal indicative of a combination of the different magnetic field signals that corresponds to the current through the conductor.

30 Claims, 9 Drawing Sheets

(51) Int. Cl.
*G01R 33/025* (2006.01)
*G01R 33/09* (2006.01)

(56) References Cited

U.S. PATENT DOCUMENTS

| | | | |
|---|---|---|---|
| 4,385,273 A | 5/1983 | Leinhard et al. |
| 4,525,668 A | 6/1985 | Lienhard et al. |
| 4,596,950 A | 6/1986 | Lienhard et al. |
| 4,691,259 A | 9/1987 | Imakoshi |
| 4,712,064 A | 12/1987 | Eckardt et al. |
| 4,772,929 A | 9/1988 | Manchester |
| 4,823,075 A | 4/1989 | Alley |
| 4,847,584 A | 7/1989 | Pant |
| 4,893,027 A | 1/1990 | Kammerer et al. |
| 4,922,606 A | 5/1990 | Alexander et al. |
| 4,926,116 A | 5/1990 | Talisa |
| 4,937,521 A | 6/1990 | Yoshino et al. |
| 4,939,448 A | 7/1990 | Gudel |
| 4,939,449 A | 7/1990 | Cattaneo et al. |
| 4,939,459 A | 7/1990 | Akachi et al. |
| 5,041,780 A | 8/1991 | Rippel |
| 5,049,809 A | 9/1991 | Wakatsuki et al. |
| 5,055,785 A | 10/1991 | Shintaku et al. |
| 5,218,279 A | 6/1993 | Takahashi et al. |
| 5,227,721 A | 7/1993 | Kataoka et al. |
| 5,247,202 A | 9/1993 | Popovic et al. |
| 5,351,027 A | 9/1994 | Kawamata et al. |
| 5,442,283 A | 8/1995 | Vig et al. |
| 5,500,590 A | 3/1996 | Pant |
| 5,561,366 A | 10/1996 | Takahaski et al. |
| 5,561,368 A | 10/1996 | Dovek et al. |
| 5,570,034 A | 10/1996 | Needham et al. |
| 5,583,725 A | 12/1996 | Coffey et al. |
| 5,621,377 A | 4/1997 | Dettmann et al. |
| 5,686,838 A | 11/1997 | van den Berg |
| 5,686,879 A | 11/1997 | Schuhl et al. |
| 5,719,494 A | 2/1998 | Dettmann et al. |
| 5,831,426 A | 11/1998 | Black, Jr. et al. |
| 5,861,747 A | 1/1999 | Kubinski |
| 5,877,705 A | 3/1999 | Sampey |
| 5,883,567 A | 3/1999 | Mullins, Jr. |
| 5,896,030 A | 4/1999 | Hasken |
| 5,945,825 A | 8/1999 | Clemens |
| 5,952,825 A | 9/1999 | Wan |
| 6,002,553 A | 12/1999 | Stearns et al. |
| 6,031,273 A | 2/2000 | Torok et al. |
| 6,094,330 A | 7/2000 | Criniti et al. |
| 6,100,686 A | 8/2000 | Van Delden et al. |
| 6,175,296 B1 | 1/2001 | Tokunaga et al. |
| 6,184,679 B1 | 2/2001 | Popovic et al. |
| 6,191,581 B1 | 2/2001 | Van Dau et al. |
| 6,300,617 B1 | 10/2001 | Daughton et al. |
| 6,310,470 B1 | 10/2001 | Hebing et al. |
| 6,315,875 B1 | 11/2001 | Sasaki |
| 6,316,931 B1 | 11/2001 | Nakagawa et al. |
| 6,323,634 B1 | 11/2001 | Nakagawa et al. |
| 6,329,818 B1 | 12/2001 | Tokunaga et al. |
| 6,331,773 B1 | 12/2001 | Engel |
| 6,356,068 B1 | 3/2002 | Steiner et al. |
| 6,392,852 B1 | 5/2002 | Sasaki |
| 6,404,191 B2 | 6/2002 | Daughton et al. |
| 6,411,078 B1 | 6/2002 | Nakagawa et al. |
| 6,424,018 B1 | 7/2002 | Ohtsuka |
| 6,426,620 B1 | 7/2002 | Taguchi et al. |
| 6,429,640 B1 | 8/2002 | Daughton et al. |
| 6,433,981 B1 | 8/2002 | Fletcher et al. |
| 6,437,558 B2 | 8/2002 | Li et al. |
| 6,445,171 B2 | 9/2002 | Sandquist et al. |
| 6,459,255 B1 | 10/2002 | Tamai et al. |
| 6,462,531 B1 | 10/2002 | Ohtsuka |
| 6,462,541 B1 | 10/2002 | Wang et al. |
| 6,501,678 B1 | 12/2002 | Lenssen et al. |
| 6,542,375 B1 | 4/2003 | Kuitenbrouwer et al. |
| 6,545,457 B2 | 4/2003 | Goto et al. |
| 6,566,856 B2 | 5/2003 | Sandquist et al. |
| 6,583,629 B1 | 6/2003 | Stokes et al. |
| 6,591,481 B2 | 7/2003 | Shimazawa et al. |
| 6,642,705 B2 | 11/2003 | Kawase |
| 6,657,826 B2 | 12/2003 | Shimazawa et al. |
| 6,667,682 B2 | 12/2003 | Wan et al. |
| 6,683,448 B1 | 1/2004 | Ohtsuka |
| 6,721,140 B2 | 4/2004 | Inoue et al. |
| 6,759,841 B2 | 7/2004 | Goto et al. |
| 6,769,166 B1 | 8/2004 | Blanchard |
| 6,781,358 B2 | 8/2004 | Goto et al. |
| 6,781,359 B2 | 8/2004 | Stauth et al. |
| 6,791,313 B2 | 9/2004 | Ohtsuka |
| 6,812,687 B1 | 11/2004 | Ohtsuka |
| 6,815,944 B2 | 11/2004 | Vig et al. |
| 6,841,989 B2 | 1/2005 | Goto et al. |
| 6,970,333 B2 | 11/2005 | Boeve |
| 6,989,665 B2 | 1/2006 | Goto |
| 6,995,957 B2 | 2/2006 | Jayasekara |
| 7,026,808 B2 | 4/2006 | Vig et al. |
| 7,075,287 B1 | 7/2006 | Mangtani et al. |
| 7,106,046 B2 | 9/2006 | Nagano et al. |
| 7,166,807 B2 | 1/2007 | Gagnon et al. |
| 7,248,045 B2 | 7/2007 | Shoji |
| 7,259,545 B2 | 8/2007 | Stauth et al. |
| 7,336,064 B2 | 2/2008 | Ludwig et al. |
| 7,358,724 B2 | 4/2008 | Taylor et al. |
| 7,476,953 B2 | 1/2009 | Taylor et al. |
| 7,495,624 B2 | 2/2009 | Daalmans |
| 7,518,354 B2 | 4/2009 | Stauth et al. |
| 7,598,601 B2 | 10/2009 | Taylor et al. |
| 7,723,983 B2 | 5/2010 | Shoji |
| 7,746,056 B2 | 6/2010 | Stauth et al. |
| 7,768,083 B2 | 8/2010 | Doogue et al. |
| 7,816,905 B2 | 10/2010 | Doogue et al. |
| 8,080,994 B2 | 12/2011 | Taylor et al. |
| 8,629,520 B2 | 1/2014 | Doogue et al. |
| 8,907,669 B2 * | 12/2014 | Petrie .................. G01R 15/207 |
| | | 324/251 |
| 9,082,957 B2 | 7/2015 | Doogue et al. |
| 9,812,637 B2 | 11/2017 | Fermon et al. |
| 10,114,044 B2 | 10/2018 | Geisler et al. |
| 10,114,085 B2 | 10/2018 | Milano et al. |
| 2002/0067162 A1 | 6/2002 | Dammkohler et al. |
| 2002/0067172 A1 | 6/2002 | Alker |
| 2002/0084105 A1 | 7/2002 | Geng et al. |
| 2002/0093332 A1 | 7/2002 | Schroeder et al. |
| 2002/0158345 A1 | 10/2002 | Hedler et al. |
| 2002/0180433 A1 | 12/2002 | Van Zon et al. |
| 2003/0043555 A1 | 3/2003 | Goller et al. |
| 2003/0047760 A1 | 3/2003 | Daeche et al. |
| 2003/0047813 A1 | 3/2003 | Goller et al. |
| 2003/0151406 A1 | 8/2003 | Wan et al. |
| 2004/0023064 A1 | 2/2004 | Ehresmann et al. |
| 2004/0027891 A1 | 2/2004 | Hartmann |
| 2004/0155644 A1 | 8/2004 | Stauth |
| 2004/0184196 A1 | 9/2004 | Jayasekara |
| 2005/0045359 A1 | 3/2005 | Doogue et al. |
| 2005/0194674 A1 | 9/2005 | Thomas et al. |
| 2005/0246114 A1 | 11/2005 | Rannow et al. |
| 2005/0248883 A1 | 11/2005 | Skoufis |
| 2005/0258820 A1 | 11/2005 | Forster |
| 2005/0280036 A1 | 12/2005 | Schroeder et al. |
| 2006/0033487 A1 | 2/2006 | Nagano et al. |
| 2006/0071655 A1 | 4/2006 | Shoji |
| 2006/0077598 A1 | 4/2006 | Taylor et al. |
| 2006/0091993 A1 | 5/2006 | Shoji |
| 2006/0114098 A1 | 6/2006 | Shoji |
| 2006/0145690 A1 | 7/2006 | Shoji |
| 2006/0170529 A1 | 8/2006 | Shoji |
| 2006/0175674 A1 | 8/2006 | Taylor et al. |
| 2006/0255797 A1 | 11/2006 | Taylor et al. |
| 2006/0284611 A1 | 12/2006 | Ishio |
| 2006/0291106 A1 | 12/2006 | Shoji |
| 2007/0025027 A1 | 2/2007 | Chung et al. |
| 2007/0044370 A1 | 3/2007 | Shoji |
| 2007/0076332 A1 | 4/2007 | Shoji et al. |
| 2007/0090825 A1 | 4/2007 | Shoji |
| 2007/0096716 A1 | 5/2007 | Shoji |
| 2007/0170533 A1 | 7/2007 | Doogue et al. |

(56) References Cited

U.S. PATENT DOCUMENTS

| | | |
|---|---|---|
| 2007/0188946 A1 | 8/2007 | Shoji |
| 2007/0247146 A1 | 10/2007 | Stauth et al. |
| 2009/0295368 A1 | 12/2009 | Doogue et al. |
| 2009/0315543 A1 | 12/2009 | Guo et al. |
| 2010/0106452 A1 | 4/2010 | Tatenuma et al. |
| 2010/0237450 A1 | 9/2010 | Doogue et al. |
| 2013/0277782 A1 | 10/2013 | Doogue et al. |
| 2013/0277783 A1 | 10/2013 | Doogue et al. |
| 2015/0192648 A1 | 7/2015 | Campiglio et al. |
| 2015/0243882 A1 | 8/2015 | Doogue et al. |
| 2015/0323568 A1 | 11/2015 | Schmitt |
| 2017/0108536 A1 | 4/2017 | Hebiguchi |
| 2017/0184635 A1* | 6/2017 | Ugge .................. G01R 15/207 |
| 2018/0038897 A1 | 2/2018 | Milano et al. |
| 2018/0306843 A1 | 10/2018 | Bussing et al. |
| 2019/0025346 A1 | 1/2019 | Latham |

FOREIGN PATENT DOCUMENTS

| | | |
|---|---|---|
| DE | 4212737 C1 | 7/1993 |
| DE | 19680089 T1 | 4/1997 |
| DE | 19650078 A1 | 6/1998 |
| DE | 10017374 A1 | 12/2000 |
| DE | 10108640 A1 | 9/2002 |
| DE | 10159607 A1 | 9/2002 |
| DE | 10120408 A1 | 10/2002 |
| DE | 10128150 C1 | 1/2003 |
| DE | 10142114 C1 | 2/2003 |
| DE | 10142118 A1 | 3/2003 |
| DE | 10143437 A1 | 3/2003 |
| DE | 10155423 A1 | 5/2003 |
| DE | 10202287 C1 | 8/2003 |
| DE | 10222395 A1 | 12/2003 |
| DE | 10228764 A1 | 1/2004 |
| DE | 10314602 A1 | 10/2004 |
| DE | 102004003369 A1 | 8/2005 |
| DE | 102004009267 B3 | 9/2005 |
| DE | 102004038847 B3 | 9/2005 |
| DE | 102004017191 A1 | 10/2005 |
| DE | 102005010156 A1 | 10/2005 |
| DE | 102004021862 A1 | 12/2005 |
| DE | 102004027273 A1 | 12/2005 |
| DE | 102004040079 B3 | 12/2005 |
| DE | 102005037905 A1 | 3/2006 |
| DE | 102004053551 A1 | 5/2006 |
| DE | 102006008257 A1 | 10/2006 |
| DE | 102006021774 A1 | 1/2007 |
| DE | 102005038655 B3 | 3/2007 |
| DE | 102005040539 A1 | 3/2007 |
| DE | 102005052688 A1 | 5/2007 |
| DE | 102006007770 A1 | 8/2007 |
| DE | 102006028250 A1 | 12/2007 |
| DE | 102006028698 B3 | 12/2007 |
| DE | 102006046736 A1 | 4/2008 |
| DE | 102006046739 A1 | 4/2008 |
| EP | 0539081 A1 | 4/1993 |
| EP | 0710850 A2 | 5/1996 |
| EP | 1111693 A2 | 6/2001 |
| EP | 1202024 B1 | 5/2002 |
| EP | 1273921 A1 | 6/2002 |
| EP | 1225453 A2 | 7/2002 |
| EP | 1443332 A1 | 8/2004 |
| EP | 1111693 A3 | 10/2004 |
| EP | 1691204 A1 | 8/2006 |
| EP | 1720027 A1 | 11/2006 |
| EP | 1865331 A2 | 12/2007 |
| EP | 2891893 | 7/2015 |
| FR | 2749664 A1 | 12/1997 |
| FR | 2860592 A1 | 4/2005 |
| GB | 2352522 A | 1/2001 |
| JP | 5687273 | 7/1981 |
| JP | S 57105977 | 6/1982 |
| JP | S 57187671 | 11/1982 |
| JP | S 58155761 | 9/1983 |
| JP | 63150384 | 10/1988 |
| JP | S 63263782 A | 10/1988 |
| JP | S8 6475969 | 3/1989 |
| JP | H 01251763 | 10/1989 |
| JP | H 0216475 | 1/1990 |
| JP | H 02170061 A | 6/1990 |
| JP | H 02212789 | 8/1990 |
| JP | H 02238372 | 9/1990 |
| JP | H 03214783 | 9/1991 |
| JP | H 04302406 | 10/1992 |
| JP | H 05010979 | 1/1993 |
| JP | H 05264701 | 10/1993 |
| JP | H 0627150 | 2/1994 |
| JP | H 08130338 | 5/1996 |
| JP | H 10142303 | 5/1996 |
| JP | H 09257835 A | 3/1997 |
| JP | H 09166612 | 6/1997 |
| JP | H 10293141 | 11/1998 |
| JP | H 10307156 A | 11/1998 |
| JP | 2000193728 | 7/2000 |
| JP | 2001227902 | 8/2001 |
| JP | 2001230598 | 8/2001 |
| JP | 2002082136 | 3/2002 |
| JP | 2002-107382 | 4/2002 |
| JP | 2003043074 | 2/2003 |
| JP | 2003215171 | 7/2003 |
| JP | 2004132790 | 4/2004 |
| JP | 2004158668 | 6/2004 |
| JP | 2004356338 A | 12/2004 |
| JP | 2005195427 | 7/2005 |
| JP | 2005253216 | 9/2005 |
| JP | 5902657 | 4/2016 |
| KR | 10-2008-0033957 | 4/2008 |
| WO | WO 94/06030 | 3/1994 |
| WO | WO 96/22542 | 7/1996 |
| WO | WO 98/01764 | 1/1998 |
| WO | WO 02/069400 A1 | 9/2002 |
| WO | WO 03/019216 | 3/2003 |
| WO | WO 2003/107018 A1 | 12/2003 |
| WO | WO 2004/072672 A1 | 12/2003 |
| WO | WO 2004/109725 | 12/2004 |
| WO | WO 2005/059967 A2 | 6/2005 |
| WO | WO 2005/081007 A1 | 9/2005 |
| WO | WO 2006/044031 A1 | 4/2006 |
| WO | WO 2006/083479 A1 | 8/2006 |
| WO | WO 2006/0117727 A1 | 11/2006 |
| WO | WO 2006/136577 A1 | 12/2006 |
| WO | WO 2007/087121 A2 | 8/2007 |
| WO | WO 2007/087121 A3 | 8/2007 |
| WO | WO 2007/147760 | 12/2007 |
| WO | WO 2009/148823 A1 | 12/2009 |
| WO | WO 2012070337 | 5/2012 |
| WO | WO 2017/199519 | 11/2017 |

OTHER PUBLICATIONS

JP Office Action dated Jul. 2, 2012; for Japanese Pat. App. No. 2008-551281; 5 pages.

JP Response to Office Action filed on Oct. 4, 2012; for Japanese Pat. App. No. 2008-551281; 11 pages.

JP Decision for Declining of Amendment; dated Sep. 27, 2012; for Japanese Pat. App. No. 2008-551281; 2 pages.

JP Decision for Rejection; dated May 16, 2013; for Japanese Pat. App. No. 2008-551281; 1 page.

Letter from Yuasa & Hara dated May 29, 2013; for Japanese Pat. App. No. 2008-551281; 3 pages.

JP Appeal Brief and Amendment (in Japanese); dated Sep. 12, 2013; for JP Pat. App. No. 2008-551281; 11 pages.

JP Claims (English Translation) as filed with Appeal Brief and Amendment; dated Sep. 12, 2013; for JP Pat. App. No. 2008-551281; 2 pages.

Letter from Yuasa and Hara dated Sep. 25, 2013; for JP Pat. App. No. 2008-551281; 1 page.

JP Notification of Reason for Rejection dated Sep. 29, 2014; for Japanese Pat. App. No. 2008-551281; 2 pages.

Letter to Yuasa and Hara dated Dec. 4, 2014 for Japanese Pat. App. No. 2008-551281; 1 page.

(56) References Cited

OTHER PUBLICATIONS

JP Claims (English translation) as filed with Response on Dec. 9, 2014; for Japanese Pat. App. No. 2008-551281; 2 pages.
Letter to Yuasa and Hara dated Mar. 23, 2015; for Japanese Pat. App. No. 2008-551281; 3 pages.
JP Argument and Amendment filed Mar. 31, 2015(in Japanese); for Japanese Pat. App. No. 2008-551281; 4 pages.
JP Claims as filed with Argument and Amendment (English translation) filed Mar. 31, 2015; for Japanese Pat. App. No. 2008-551281; 2 pages.
Letter from Yuasa and Hara dated Apr. 3, 2015; for Japanese Pat. App. No. 2008-551281; 2 pages.
KR Office Action with a Summary of the Office Action in English; dated Nov. 13, 2012; for KR Pat. App. No. 10-2008-7018642; 21 pages.
Letter to $21^{st}$ Century Patent & Law Firm dated Dec. 14, 2012; including "DCMD Proposed Amended Claims Beginning From PCT Claims;" for Korean Patent Application No. 10-2008-7018642; 21 pages.
Letter to $21^{st}$ Century Patent & Law Firm dated Jun. 25, 2013; for KR Pat. App. No. 10-2008-7018642; 4 pages.
KR Response to Office Action; filed Jul. 17, 2013; for KR Pat. App. No. 10-2008-7018642; 19 pages.
KR Notice of Allowance (with English translation) dated Nov. 20, 2013; for Korean Pat. App. No. 10-2008-7018642; 3 pages.
KR Allowed Claims (English translation) dated Nov. 20, 2013; for Korean Pat. App. No. 10-2008-7018642; 17 pages.
Office Action dated May 19, 2011; for U.S. Appl. No. 12/792,245; 21 pages.
Response filed Aug. 16, 2011; to Office Action dated May 19, 2011; for U.S. Appl. No. 12/792,245; 14 pages.
Final Office Action dated Oct. 28, 2011; for U.S. Appl. No. 12/792,245; 23 pages.
Response filed Dec. 29, 2011; to Final Office Action dated Oct. 28, 2011; for U.S. Appl. No. 12/792,245; 14 pages.
Request for Continued Examination; filed on Feb. 16, 2012; for U.S. Appl. No. 12/792,245; 3 pages.
Office Action dated Mar. 28, 2013; for U.S. Appl. No. 12/792,245; 18 pages.
Response filed Apr. 25, 2013; to Office Action dated Mar. 28, 2013; for U.S. Appl. No. 12/792,245; 21 pages.
Notice of Allowance dated May 31, 2013; for U.S. Appl. No. 12/792,245; 10 pages.
Notice of Allowance; dated Sep. 16, 2013; for U.S. Appl. No. 12/792,245; 11 pages.
EP Extended Search Report dated Feb. 1, 2011 for EP Pat. App. No. 10195143.2; 9 pages.
EP Response to Official Communication; dated Mar. 7, 2011; for EP Pat. App. No. 10195143.2; filed on Sep. 1, 2011; 46 pages.
EP Notice of Allowance; dated Oct. 28, 2011; for EP Pat. App. No. 10 195 143.2; 7 pages.
EP Notice of Opposition (in German) from the European Patent Office; dated Jan. 15, 2013; with regard to EP Pat. App. No. 10195143.2; 50 pages.
Letter from A.A.Thornton & Co.; dated Feb. 20, 2013; with regard to EP Pat. No. 10195143.2; 2 pages.
Letter from A.A. Thornton & Co. to the European Patent Office; dated Aug. 8, 2013; for European Pat. App. No. 2290379; 1 pages.
EP Response to the Opposition by Micronas GmbH; received Aug. 9, 2013; for European Pat. No. 2290379; 15 pages.
EP Summons to Attend Oral Proceedings and Summary of Facts and Submission dated Feb. 16, 2015; for European Pat. App. No. 10195143.2; 12 pages.
Letter from Koch Muller dated Sep. 8, 2015; for European Pat. No. EP 2 290 379 B1; 6 pages.
Response (with First, Second and Third Auxiliary Request Claims) to European Appeal Statement from the Opponent dated Dec. 17, 2015 for European Application No. 2290379; Response filed on Sep. 14, 2016; 15 Pages.

EP Provision of the Minutes in Accordance with Rule 124(4) EPC dated Dec. 17, 2015; for European Pat. No. 2290379; 16 pages.
Email from A. A. Thornton & Co. dated Feb. 12, 2016; for European Pat. No. 2290379; 2 pages.
Statement of Grounds of Appeal (following opposition); English Translation dated Apr. 25, 2016; European Patent No. EP 2290379 B1; 46 pages.
EPO Response to patent proprietor's submission filed on Oct. 17, 2017 for EP Patent No. EP 2290379 B1; 10 pages.
JP Notification of Rejection; dated Oct. 23, 2012; for JP Pat. App. No. 2011-264267; 3 sheets.
JP Response to Notification of Rejection (in Japanese); filed on Apr. 16, 2013; for Japanese Pat. App. No. 2011-264267; 6 pages.
Letter from Yuasa & Hara dated Apr. 25, 2013; for Japanese Pat. App. No. 2011-264267; 1 page.
JP Notification of Reason for Rejection; dated Aug. 19, 2013; for Japanese Pat. App. No. 2011-264267; 3 pages.
Letter from Yuasa & Hara dated Aug. 21, 2013; for Japanese Pat. App. No. 2011-264267; 2 pages.
JP Argument and Amendment filed Feb. 18, 2014 (in Japanese); for Japanese Pat. App. No. 2011-264267; 5 pages.
JP Claims (English translation) filed in Japanese Argument and Amendment filed Feb. 18, 2014; for Japanese Pat. App. No. 2011-264267; 4 pages.
Letter from Yuasa and Hara dated Feb. 25, 2014; for Japanese Pat. App. No. 2011-264267; 1 page.
JP Letter from Yuasa and Hara dated Sep. 19, 2014; for Japanese Pat. App. No. 2011-264267; 1 pages.
Office Action dated Jan. 14, 2014; for U.S. Appl. No. 13/918,064; 36 pages.
Notice of Allowance dated May 27, 2014 from U.S. Appl. No. 13/918,064; 11 pages.
Corrected Notice of Allowability dated Sep. 2, 2014; for U.S. Appl. No. 13/918,064; 9 pages.
Notice of Allowance dated Sep. 15, 2014; from U.S. Appl. No. 13/918,064; 9 pages.
312 Amendment filed Oct. 22, 2014; for U.S. Appl. No. 13/918,064; 6 pages.
EP Extended Search Report Feb. 1, 2011 for EP Pat. App. No. 10195145.7; 5 pages.
EP Notice of Allowance; dated Oct. 28, 2011; for EP Pat. App. No. 10 195 145.7; 7 pages.
EP Notice of Opposition from the European Patent Office; dated Jan. 15, 2013; with regard to EP Pat. App. No. 10195145.7; 24 pages.
Letter from A.A.Thornton & Co.; dated Feb. 20, 2013; with regard to EP Pat. App. No. 10195145.7; 2 pages.
Letter from A.A. Thornton & Co. to the European Patent Office; dated Aug. 14, 2013; for European Pat. No. 10195145.7; 1 page.
EP Response to the Opposition by Micronas GmbH; received Aug. 12, 2013; for European Pat. No. 2290380; 10 pages.
EP Summons to Attend Oral Proceedings and Summary of Facts and Submission dated Feb. 23, 2015; for European Pat. App. No. 10195145.7; 10 pages.
Letter from Koch Muller dated Sep. 13, 2015; for European Pat. App. No. EP 2 290 380 B1; 9 pages.
EP Decision Rejecting the Opposition dated Dec. 15, 2015; for European Pat. No. 2290380; 11 pages.
EP Provision of the Minutes in Accordance with Rule 124(4) EPC dated Dec. 15, 2015; For European Pat. No. 2290380; 8 pages.
Email from A. A. Thornton & Co. dated Feb. 12, 2016; for European Pat. No. 2290380; 2 pages.
Statement of Grounds of Appeal (following opposition); English Translation; European Patent No. EP 2290380 B1; Apr. 25, 2016,20 pages.
Response (with First, Second and Third Auxiliary Request Claims) to European Appeal Statement from the Opponent dated Dec. 15, 2015 for European Application No. 2290380; Response filed on Sep. 14, 2016; 15 Pages.
EPO Response to patent proprietor's submission filed on Oct. 17, 2017 for EP Patent No. EP 2290380 B1; 6 pages.
JP Notification of Reason for Rejection (English Translation) dated Mar. 6, 2014; for Japanese Pat. App. No. 2013-085409; 3 pages.

(56) References Cited

OTHER PUBLICATIONS

Letter to Yuasa and Hara dated Aug. 8, 2014; for Japanese Pat. App. No. 2013-085409; 9 pages.
JP Argument and Amendment filed Aug. 26, 2014 (in Japanese); for Japanese Pat. App. No. 2013-085409; 7 pages.
JP Pending Amended Claims filed Aug. 26, 2014; for Japanese Pat. App. No. 2013-085409; 5 pages.
Letter from Yuasa and Hara dated Sep. 9, 2014; for Japanese Pat. App. No. 2013-085409; 1 page.
JP Decision for Rejection (English translation) dated Nov. 7, 2014; for Japanese Pat. App. No. 2013-085409; 2 pages.
Office Action dated Sep. 25, 2014; for U.S. Appl. No. 13/918,075; 47 pages.
Response filed Jan. 21, 2015; to Office Action dated Sep. 25, 2014; for U.S. Appl. No. 13/918,075; 13 pages.
Notice of Allowance dated Feb. 17, 2015; for U.S. Appl. No. 13/918,075; 17 pages.
EP Extended Search Report dated Feb. 1, 2011 for EP Pat. App. No. 10195147.3; 5 pages.
EP Response to Official Communication; dated Mar. 7, 2011; for EP Pat. App. No. 10195147.3; filed on Sep. 1, 2011; 27 pages.
EP Notice of Allowance; dated Nov. 14, 2011; for EP Pat. App. No. 10 195 147.3; 7 pages.
EP Notice of Opposition from the European Patent Office; dated Jan. 15, 2013; with regard to EP Pat. App. No. 10195147.3; 44 pages.
Letter from A.A.Thornton & Co.; dated Feb. 20, 2013; with regard to EP Pat. App. No. 10195147.3; 2 pages.
Letter from A.A. Thornton & Co. to the European Patent Office; dated Aug. 8, 2013; for European Pat. No. 2290381; 1 pages.
EP Response to the Opposition by Micronas GmbH; for European Pat. App. No. 2290381; 9 pages.
EP Summons to Attend Oral Proceedings and Summary of Facts and Submission dated Feb. 23, 2015; for European Pat. No. 10195147.3; 12 pages.
Letter from Koch Muller dated Sep. 14, 2015; for European Pat. No. EP 2 290 381 B1; 11 pages.
EP Interlocutory Decision in Opposition Proceedings dated Dec. 17, 2015; for European Pat. No. 2 290 381; 38 pages.
EP Provision of the Minutes in Accordance with Rule 124(4) EPC dated Dec. 17, 2015; for European Pat. No. 2 290 381; 14 pages.
Email from A. A. Thornton & Co. dated Feb. 12, 2016; for European Pat. No. 2290381; 2 pages.
Statement of Grounds of Appeal (following opposition); English Translation; European Patent No. EP 2290379 B1; Apr. 27, 2016, 36 pages.
EP Patent Office Munich Response to Appeal dated Sep. 19, 2016; in opposition against Divisional European Patent No. 2290381, 15 pages.
EPO Response to patent proprietor's submission filed on Oct. 17, 2017 for EP Patent No. EP 2290381 B1; 10 pages.
JP Office Action dated May 15, 2014; Application No. 2013-189638; 6 pages.
Letter to Yuasa and Hara dated Nov. 11, 2014; for Japanese Pat. App. No. 2013-189638; 4 pages.
JP Amendment dated Nov. 18, 2014 9 (in Japanese); for Japanese Pat. App. No. 2013-189638; 6 pages.
JP Pending Claims filed Nov. 18, 2014; for Japanese Pat. App. No. 2013-189638; 4 pages.
Letter from Yuasa and Hara dated Nov. 27, 2014; for Japanese Pat. App. No. 2013-189638; 1 page.
JP Decision of Final Rejection received Apr. 10, 2015 (in Japanese);; for Japanese Pat. App. No. 2013-189638; 5 pages.
Appeal and Notice of Appeal (with English claims), dated Aug. 10, 2015, to Japanese Office Action; for Japanese Pat. App. No. 2013-189638; 13 pages.
Translation of Office Action dated Nov. 4, 2015; for Japanese Pat. App. No. 2013-189638; 1 page.
Letter from Yuasa and Hara dated Nov. 9, 2015; for Japanese Pat. App. No. 2013-189638; 3 pages.

Response with English translation of Claim Amendments dated Feb. 4, 2016 (in Japanese); to Japanese Office Action; for Japanese Pat. App. No. 2013-189638; 7 pages.
Letter from Yuasa and Hara dated Feb. 15, 2016; for Japanese Pat. App. No. 2013-189638; 2 pages.
Letter from Yuasa and Hara dated Feb. 24, 2016; for Japanese Pat. App. No. 2013-189638; 1 page.
Japanese NOA dated Feb. 24, 2016 with allowed claims (in Japanese); for Japanese Pat. App. No. 2013-189638; 5 pages.
Letter from Yuasa and Hara with Patented Claims dated May 11, 2016; for Japanese Pat. No. 5902657; 3 pages.
Office Action dated Jul. 21, 2016 for U.S Appl. No. 14/707,319; 63 pages.
Response to Office Action filed Sep. 29, 2016 for U.S. Appl. No. 14/707,319; 13 pages.
Request for Continued Examination filed on Jan. 18, 2017 for U.S. Appl. No. 14/707,319; 2 pages.
Office Action dated Mar. 23, 2017 for U.S. Appl. No. 14/707,319; 17 pages.
Response to Office Action dated Mar. 23, 2017 filed on Jun. 2, 2017 for U.S. Appl. No. 14/707,319; 14 pages.
Notice of Allowance dated Oct. 30, 2017 for U.S. Appl. No. 14/707,319; 10 pages.
JP Notification of Reason for Rejection dated Nov. 14, 2014 (in Japanese); for Japanese Pat. App. No. 2014-028213; 6 pages.
JP Argument and Amendment filed May 13, 2015 (in Japanese); for Japanese Pat. App. No. 2014-028213; 12 pages.
JP Claims (English Translation) as filed with Japanese Argument and Amendment filed May 13, 2015; for Japanese Pat. App. No. 2014-028213; 7 pages.
Notice of Allowance with English Allowed Claims dated Oct. 26, 2015 (in Japanese); for Japanese Pat. App. No. 2014-028213; 9 pages.
Letter from Yuasa and Hara dated Oct. 28, 2015; for Japanese Pat. App. No. 2014-028213; 1 page.
Office Action dated Feb. 6, 2018 for U.S. Appl. No. 15/395,083; 14 pages.
Response to Office Action filed Mar. 23, 2018, 2018 for U.S. Appl. No. 15/395,083; 8 pages.
Notice of Allowance dated May 23, 2018 for U.S. Appl. No. 15/395,083; 8 pages.
JP Office Action with English Translation dated Feb. 22, 2016; for Japanese Pat. App. No. 2015-045607; 10 pages.
JP Response to Office Action dated Jun. 21, 2016 (in Japanese); for Pat. App. No. JP 2015-045607; 9 pages.
Letter from Yuasa and Hara dated Jun. 28, 2016; for Pat. App. No. JP 2015-045607; 2 pages.
New Claims on file dated Jun. 28, 2016; for Pat. App. No. JP 2015-045607; 10 pages.
Translation of Second Japanese Office Action with Reasons for Rejection dated Dec. 27, 2016; for Japanese Pat. Appl. No. 2015-045607; 5 pages.
Letter to Yuasa and Hara dated Jan. 30, 2017 for JP Pat. Appl. No. 2015-045607; 8 pages.
Letter to Yuasa and Hara dated Feb. 10, 2017 for JP Pat. Appl. No. 2015-045607; 6 pages.
Yuasa and Hara letter dated Feb. 10, 2017 regarding response for JP Appl. No. 2015-045607; 5 pages.
New Japanese Claims filed on Feb. 10, 2017 for JP Appl. No. 2015-045607; 11 pages.
Letter from Yuasa and Hara dated Feb. 17, 2017 for JP Appl. No. 2015-045607; 2 pages.
Decision of Final Rejection dated May 12, 2017 for JP Pat. Application No. 2015-45607; 5 pages.
Japanese Allowance Report dated Jun. 25, 2018 for Japanese Application No. JP 2015-045607; 1 Page.
Allowed Japanese Claims in English dated Jun. 25, 2018 for Japanese Application No. JP 2015-045607; 10 Pages.
Letter from Yuasa and Hara dated Sep. 15, 2017 for JP Appl. No. 2015-045607; 2 pages.
Japanese Office Action dated Jul. 29, 2016 with English translation, Application No. 2015-157901, 10 pages.

(56) References Cited

OTHER PUBLICATIONS

Response to Japanese Office Action dated Dec. 21, 2016 (in Japanese); for Japanese Application No. 2015-157901, 9 pages.
English Translation of New Claims filed on Dec. 21, 2016; for JP App. No. 2015-157901; 2 pages.
Letter from Yuasa and Hara dated Jan. 11, 2017 for JP Pat. App. No. 2015-157901; 2 pages.
Allowed Claims from Yuasa & Hara Allowance Report dated May 15, 2017 for JP Pat. Appl. No. 2015-157901; 2 pages.
New Japanese Claims filed on Sep. 13, 2017 for JP Appl. No. 2017-173831; 10 pages.
Letter from Yuasa and Hara dated Sep. 15, 2017 for JP Appl. No. 2017-173831; 3 pages.
Office Action dated Jan. 25, 2010 for U.S. Appl. No. 12/131,339; 12 pages.
Response to Office Action dated Jan. 25, 2010 and filed on Feb. 16, 2010 for U.S. Appl. No. 12/131,339; 10 pages.
Final Office Action dated Apr. 16, 2010 for U.S. Appl. No. 12/131,339; 15 pages.
Response to Final Office Action dated Apr. 16, 2010 and filed on Jul. 16, 2010 for U.S. Appl. No. 12/131,339; 13 pages.
Notice of Allowance dated Jul. 29, 2010 for U.S. Appl. No. 12/131,339; 9 pages.
PCT Search Report and Written Opinion of the ISA dated Nov. 5, 2009 for PCT/US2009/044614; 14 pages.
PCT International Preliminary Report on Patentability and Written Opinion dated Dec. 16, 2010 for PCT/US2009/044614; 7 pages.
Chinese Office Action dated Sep. 28, 2012 (in Chinese); for Chinese Pat. App. No. 200980115608.6; 5 pages.
Chinese Office Action; dated May 2, 2013 (in Chinese); for Chinese Pat. App. No. 200980115608.6; 9 pages.
Translation of Chinese Office Action; dated May 2, 2013; for Chinese Pat. App. No. 200980115608.6; 8 pages.
Letter from NTD Patent & Trademark Agency Limited; dated May 17, 2013; for Chinese Pat. App. No. 200980115608.6; 1 page.
Letter to NTD Patent and Trademark Agency Ltd.; dated Jun. 24, 2013; regarding Chinese Pat. App. No. 200980115608.6; 8 pages.
Chinese Response to Office Action; received Jul. 22, 2013; to Chinese Office Action dated May 2, 2013; for Chinese Pat. App. No. 200980115608.6; 8 pages.
Letter from NTD Patent and Trademark Agency Ltd.; dated Jul. 22, 2013; regarding Chinese Pat. App. No. 200980115608.6; 1 page.
Chinese Notice of Completing Formalities for Patent Registration and Notice of Granting Patent Right for Invention; dated Aug. 1, 2013; for Chinese Pat. App. No. 200980115608.6; 2 pages.
Letter to Kuhnen & Wacker dated Mar. 16, 2016; for German Pat. App. 112009001350.3; 2 pages.
Letter from Kuhnen & Wacker dated May 19, 2016; for German Pat. App. 112009001350.3; 2 pages.
Request for Examination dated Mar. 19, 2016 (in German); for German Pat. App. 112009001350.3; 13 pages.
JP Notice of Reasons for Rejection dated Jul. 25, 2013; for Japanese Pat. App. 2011-511715; 5 pages.
JP Argument and Amendment filed Oct. 23, 2013 (in Japanese); for Japanese Pat. No. 2011-511715; 10 pages.
JP Claims filed with Japanese Argument and Amendment filed on Oct. 23, 2013; for Japanese Pat. No. 2011-511715; 4 pages.
Letter from Yuasa and Hara dated Nov. 12, 2013; for Japanese Pat. No. 2011-511715; 2 pages.
JP Final Decision of Rejection dated May 9, 2014 for Japanese Patent Application No. 2011-511715; 3 pages.
JP Demand of Appeal and Amendment (in Japanese) (with English claims) filed on Sep. 2, 2014; for Japanese Pat. App. No. 2011-511715; 11 pages.
JP Notice of Reasons for Rejection (English translation) dated May 15, 2015; for Japanese Pat. App. No. 2011-511715; 7 pages.
Letter to Yuasa and Hara dated Jul. 15, 2015; for Japanese Pat. App. No. 2011-511715; 3 pages.
Response (with English Claims) (in Japanese); for Japanese Pat. App. No. 2011-511715; 8 pages.

JP Judgment in Trial with English Translation dated Nov. 16, 2015 (in Japanese); for Japanese Pat. App. No. 2011-511715; 15 pages.
KR Notice to Submit a Response dated Jan. 6, 2015; for Korean Pat. App. No. 10-2010-7029241; 19 pages.
Email from $21^{st}$ Century Patent & Law Firm dated Jan. 6, 2015; for Korean Pat. App. No. 10-2010-7029241; 2 pages.
KR Final Notice to Submit a Response dated Jun. 17, 2015; for Korean Pat. App. No. 10-2010-7029241; 21 pages.
Email from $21^{st}$ Century Patent & Law Firm dated Jun. 18, 2015; for Korean Pat. App. No. 10-2010-7029241; 2 pages.
Letter to $21^{st}$ Century Patent and Law Firm, including claims, dated Jul. 31, 2015; for Korean Pat. App. No. 10-2010-7029241; 12 pages.
Email from $21^{st}$ Century Patent and Law Firm dated Sep. 7, 2015; for Korean Pat. App. No. 10-2010-7029241; 2 pages.
Response and Amendment dated Sep. 7, 2015; for Korean Pat. App. No. 10-2010-7029241; 28 pages.
KR Notice of Decision of Refusal dated Dec. 1, 2015; for Korean Pat. App. No. 10-2010-7029241; 4 pages.
Letter from $21^{st}$ Century Patent and Law Firm dated Dec. 15, 2015; for Korean Pat. App. No. 10-2010-7029241; 2 pages.
Letter from $21^{st}$ Century Patent and Law Firm dated Feb. 11, 2016; for Korean Pat. App. No. 10-2010-7029241; 1 page.
$21^{st}$ Century Patent & Law Firm letter re: Trial Decision Rejection dated Oct. 27, 2017 for KR Pat. Appl. No. 10-2010-7029241; 1 page.
JP Notice of Reasons for Rejection dated Apr. 16, 2015; for Japanese Pat. App. No. 2014-177801; 5 pages.
JP Letter to Yuasa and Hara dated Jul. 6, 2015; for Japanese Pat. App. No. 2014-177801; 33 pages.
JP Response (with claims in English) filed Jul. 15, 2015 (in Japanese); for Japanese Pat. App. No. 2014-177801; 12 pages.
JP Letter from Yuasa and Hara dated Jul. 22, 2015; for Japanese Pat. App. No. 2014-177801; 1 page.
JP Reasons for Rejection dated Dec. 22, 2015 (with English translation); for Japanese Pat. App. No. 2014-177801; 10 pages.
Letter from Yuasa and Hara dated Jan. 26, 2016; for Japanese Pat. App. No. 2014-177801; 3 pages.
U.S. Appl. No. 16/055,644, filed Aug. 6, 2018, Lassalle-Balier, et al.
Awad et al; "Stacked-Chip Packaging: Electrical, Mechanical, and Thermal Challenges;" IEEE 2004 Electronic Components and Technology Conference, vol. 2; Jun. 2004; 6 pages.
Carson et al; "Stack Die CSP Interconnect Challenges;" Slideshow Presentation, IEEE/CMPT Seminar; date unknown; Sep. 8, 2015, 13 pages.
Data Sheet; "High-Speed Digital Isolators, AduM1100AR/AduM1100BR;" as published by Analog Devices, Inc.; 2001, 12 pages.
Daughton "Spin-Dependent Sensors" IEEE, vol. 91, No. 5, May 2003, 6 pages.
"Flip-Chip-Montage;" Wikipedia (with English translation); Aug. 7, 2015; 12 pages.
Hartmann; "Magnetfeldsensoren;" Institut fur Experimentalphysik, Universitat des Saarlandes, Sep. 13, 2015; 2 pages.
Hirota et al.; "Giant Magneto-Resistance Devices;" Springer Series in Surface Sciences, 40; ISBN-10: 3540418199; ISBN-13: 9783540418191, Jan. 1995, 9 pages.
IEEE 100; "The Authoritative Dictionary of IEEE Standards Terms, Seventh Edition;" Feb. 27, 2007; 3 pages.
Intel "The Chip Scale Package (CSP);" Intel 2000 Packaging Databook; Jan. 2000; 16 pages.
Melexis Integrated Systems; "CSA-1V Current Sensor;" www.melexis.com/ProdMain.aspx?nID=614; Aug. 2004; 2 pages.
Mitsui High Tec; "IC Leadframes;" downloaded on Sep. 23, 2011; http://mitsui-high-tec.com/en/prd/lf/index.html; 2 pages.
Partin et al.; "Temperature Stable Hall Effect Sensors;" IEEE Sensors Journal, vol. 6, No. 1; Feb. 2006;5 pages.
PC Magazine Encyclopedia; "Definition of lead frame;" data sheet downloaded Sep. 23, 2011; http://www.pcmag.com/encyclopedia_term/0,2542,t=lead+frame&i=45990,00.asp; 2 pages.
Pernia et al.; "Characteristics and Design of a Current Sensor Using Multilayer Co/Ni Structures;" IEEE, 1998, 6 pages.

(56) References Cited

OTHER PUBLICATIONS

Sentron A Melexis Company; "Operation and Application of the Sentron CAS-1V-SO Surface Mount Current Sensor;" Current Sensing with the CSA-1V Hall IC, AN_102; Aug. 2004; 14 pages.
Siliconfareast.com; "Lead Frames;" data sheet downloaded on Sep. 26, 2011; http://www.siliconfareast.com/leadframes.htm; 2 pages.
Takenaga et al.; "High-Temperature Operations of Rotation Angle Sensors with Spin-Valve-Type Magnetic Tunnel Junctions;" IEEE Transactions on Magnetics; vol. 41, No. 10; Oct. 2005; 3 pages.
Taylor, et al.; "A Spin-Valve Based SOIC8 Current Sensor;" Allegro Microsystems, Inc. internal document; Aug. 17, 2006; 5 pages.
"Utilization of GMR Materials. Analog Bridge Output Devices;" pp. 1-3; NVE Corporation on website: www.nve.com/technical/explinations/Bridge.html, 3 pages.
Wikipedia; "Electronic Component;" downloaded Sep. 26, 2011; http://en.wikipedia.org/wiki/Electronic_component; 10 pages.
Xiao et al.: "An Overview of Integratable Current Sensor Technologies;" IEEE Mar. 2003; 0-7803-7883; 8 pages.
For U.S. Appl. No. 10/364,442, filed Feb. 11, 2003 U.S. Pat. No. 7,259,545, issued Aug. 21, 2007; Part 1 of 2; 296 pages.
For U.S. Appl. No. 10/364,442, filed Feb. 11, 2003 U.S. Pat. No. 7,259,545, issued Aug. 21, 2007; Part 2 of 2; 299 pages.
PCT Invitation to Pay Additional Fees; PCT Application No. PCT/US03/34141 dated Apr. 23, 2004; 7 pages.
PCT Search Report; PCT Application No. PCT/US03/34141 dated Jun. 17, 2004; 10 pages.
JP Office Action dated May 26, 2008 for Japanese Appl. No. 2004-568309, 1 page.
Response to JP Office Action dated May 26, 2008 for Japanese Appl. No. 2004-568309 filed Aug. 26, 2008, 16 page.
JP Office Action dated Mar. 23, 2009 for Japanese Appl. No. 2004-568309,2 pages.
Response to JP Office Action dated Mar. 23, 2009 for Japanese Appl. No. 2004-568309 filed Jul. 17, 2009, 13 pages.
JP Office Action dated Nov. 2, 2009 for Japanese Appl. No. 2004-568309,1 page.
For U.S. Appl. No. 11/767,631, filed Jun. 25, 2007; U.S. Pat. No. 7,518,354, issued Apr. 14, 2009; Part 1 of 5; 271 pages.
For U.S. Appl. No. 11/767,631, filed Jun. 25, 2007; U.S. Pat. No. 7,518,354, issued Apr. 14, 2009; Part 2 of 5; 266 pages.
For U.S. Appl. No. 11/767,631, filed Jun. 25, 2007; U.S. Pat. No. 7,518,354, issued Apr. 14, 2009; Part 3 of 5; 270 pages.
For U.S. Appl. No. 11/767,631, filed Jun. 25, 2007; U.S. Pat. No. 7,518,354, issued Apr. 14, 2009; Part 4 of 5; 278 pages.
For U.S. Appl. No. 11/767,631, filed Jun. 25, 2007; U.S. Pat. No. 7,518,354, issued Apr. 14, 2009; Part 5 of 5; 233 pages.
Extended European Search Report dated Sep. 26, 2017 for EP Patent Application No. 11192118.5; 7 pages.
Extended European Search Report dated Sep. 26, 2017 for EP Patent Application No. 11192124.3; 6 pages.
Extended European Search Report dated Oct. 19, 2017 for EP Patent Application No. 11192127.6; 7 pages.
Extended European Search Report dated Oct. 17, 2017 for EP Patent Application No. 11192131.8; 7 pages.
PCT Search Report and Written Opinion of the ISA for PCT/US2006/000363 dated May 5, 2006; 14 pages.
PCT International Preliminary Report on Patentability for PCT/US2006/000363 dated Aug. 16, 2007; 10 pages.
For U.S. Appl. No. 10/962,889 on Mar. 10, 2008, filed Oct. 12, 2004; file through Mar. 10, 2009, 246 pages.
PCT Search Report and Written Opinion of the ISA for PCT/US2005/029982 dated Jan. 18, 2006; 13 pages.
EP Office Action dated Apr. 25, 2008 for European Appl. No. 05794713.7; 7 pages.
For U.S. Appl. No. 11/335,944; issued as U.S. Pat. No. 7,768,083; 106 pages.
Restriction Requirement dated May 15, 2008 for U.S. Appl. No. 11/335,944; 5 pages.
Response to Restriction Requirement dated May 15, 2008 for U.S. Appl. No. 11/335,944; 1 page.

Office Action dated Apr. 6, 2009 for U.S. Appl. No. 11/335,944; 18 pages.
Response to Office Action dated Apr. 6, 2009 for U.S. Appl. No. 11/335,944, filed Jul. 6, 2009; 17 pages.
Office Action dated Nov. 16, 2009 for U.S. Appl. No. 11/335,944, filed Jul. 6, 2009; 16 pages.
Response to Office Action dated Nov. 16, 2009 for U.S. Appl. No. 11/335,944, filed Dec. 23, 2009; 19 pages.
Notice of Allowance dated Jan. 28, 2010; for U.S. Appl. No. 11/335,944; 6 pages.
312 Amendment filed May 20, 2010; for U.S. Appl. No. 11/335,944; 7 pages.
Response dated Jun. 1, 2010; to 312 Amendment; for U.S. Appl. No. 11/335,944; 2 pages.
PCT Search Report and Written Opinion of the ISA for PCT/US2007/000093 dated Feb. 5, 2008; 13 pages.
PCT Notification Concerning Transmittal of International Preliminary Report on Patentability; for PCT/US2007/000093, dated of Jul. 31, 2008, 9 pages.
EP Office Action dated Dec. 5, 2008 for EP Pat. App. No. 07 716 253.5; 3 pages.
EP Response to Official Communication dated Dec. 5, 2008, for EP Pat. App. No. 07 716 253.5 filed on Jun. 8, 2009; 14 sheets.
EP Official Communication dated Apr. 19, 2011 for European Pat. App. No. 07 716 253.5-2216; 4 pages.
EP Response to Official Communication dated Apr. 19, 2011; for EP Pat. App. No. 07716253.5; filed on Aug. 19, 2011; 9 pages.
EP Notice of Allowance; dated Nov. 8, 2011; for EP Pat. App. No. 07 716 253.5; 7 pages.
EP Notice of Opposition (in German) from the European Patent Office; dated Jan. 14, 2013; with regard to EP Pat. App. No. 07716253.5; 51 pages.
EP Response to the Opposition by Micronas GmbH; for European Pat. No. 1974223; 14 pages.
Letter from A.A. Thornton & Co. to the European Patent Office; dated Aug. 8, 2013; for European Pat.No. 194223; 1 page.
Letter from A.A.Thornton & Co.; dated Feb. 20, 2013; with regard to EP Pat. App. No. 07716253.5; 2 pages.
Letter from Koch Muller dated Sep. 7, 2015; for European Pat. No. EP 1 974 223 B1; 5 pages.
EP Summons to Attend Oral Proceedings and Summary of Facts and Submission dated Feb. 19, 2015; for European Pat. App. No. 07716253.5; 12 pages.
EP Interlocutory Decision in Opposition Proceedings dated Dec. 15, 2015; for European Pat. No. 1974223; 39 pages.
EP Provision of the Minutes in Accordance with Rule 124(4) EPC dated Dec. 15, 2015; for European Pat. No. 1974223; 14 pages.
Response (with First, Second and Third Auxiliary Request Claims) to European Appeal Statement from the Opponent dated Dec. 15, 2015 for European Application No. 077116253.5; Response filed on Sep. 14, 2016; 15 Pages.
Statement of Grounds of Appeal (following opposition); English Translation; European Patent No. EP 1974223 B1; Apr. 25, 2016, 42 pages.
EPO Response to patent proprietor's submission filed on Oct. 13, 2017 for EP Patent No. EP 1974223 B1; 8 pages.
JP Office Action; dated Aug. 3, 2011; for JP Pat. App. No. 2008-551281; 4 pages.
Response to JP Official Communication; dated Aug. 3, 3011; for JP Pat. App. No. 2008-551281; filed Dec. 9, 2011; 10 pages.
Letter from Yuasa & Hara dated Sep. 16, 2011; for JP Pat. App. No. 2008-551281; 2 pages.
Preliminary Amendment filed Nov. 5, 2018 for U.S. Appl. No. 16/055,644; 8 pages.
Office Action dated Nov. 18, 2019 for U.S. Appl. No. 16/055,644; 13 pages.
Response to Office Action filed Jan. 17, 2020 for U.S. Appl. No. 16/055,644; 13 pages.
Notice of Allowance dated Feb. 5, 2020 for U.S. Appl. No. 16/055,644; 7 pages.

* cited by examiner

| | | | | |
|---|---|---|---|---|
| Cap | | Ta | 5 nm | Non-magnetic |
| Pinning | | PtMn or IrMn | 5-15 nm | Antiferromagnetic |
| Pinned | | CoFe | 2 nm | Ferromagnetic |
| Spacer | | Ru | 1.7-2.3 or 3.0-3.7 nm | Non-magnetic |
| Free (608) | | NiFe | 5 nm | Ferromagnetic |
| | | 602 CoFe | 1 nm | Ferromagnetic |
| Spacer | | Cu | 2.4 nm | Non-magnetic |
| Pinned | | CoFe | 2.1 nm | Ferromagnetic |
| Spacer (Pinned SAF) | | Ru | 0.85 nm | Non-magnetic |
| Pinned | | CoFe | 2.0 nm | Ferromagnetic |
| Pinning | | 606 PtMn | 25 nm | Antiferromagnetic |
| Pinned | | CoFe | 2.0 nm | Ferromagnetic |
| Spacer (Pinned SAF) | | Ru | 0.85 nm | Non-magnetic |
| Pinned | | CoFe | 2.1 nm | Ferromagnetic |
| Spacer | | 604 Cu | 2.4 nm | Non-magnetic |
| Free (610) | | CoFe | 1 nm | Ferromagnetic |
| | | NiFe | 5 nm | Ferromagnetic |
| Spacer | | Ru | 1.0-1.7 or 2.3-3.0 nm | Non-magnetic |
| Pinned | | CoFe | 2.0 nm | Ferromagnetic |
| Pinning | | PtMn or IrMn | 5-15 nm | Antiferromagnetic |
| Seed | | Ru | 1.0 nm | Non-magnetic |

*FIG. 6*

CURRENT SENSOR HAVING MULTIPLE SENSITIVITY RANGES

CROSS REFERENCE TO RELATED APPLICATIONS

Not Applicable.

STATEMENT REGARDING FEDERALLY SPONSORED RESEARCH

Not Applicable.

FIELD

This disclosure relates generally to current sensors.

BACKGROUND

Some conventional electrical current sensors are positioned near a current-carrying conductor to sense a magnetic field generated by the current through the conductor. The current sensor generates an output signal having a magnitude proportional to the magnetic field induced by the current through the conductor.

Current sensors can be arranged in either an open loop or a closed loop configuration. An "open loop" current sensor includes a magnetic field transducer in proximity to a current-carrying, or primary, conductor. The magnetic field transducer provides an output signal proportional to the magnetic field generated by current passing through the primary conductor. A "closed loop" current sensor additionally includes a secondary conductor in proximity to the magnetic field transducer. A current is passed through the secondary conductor in order to generate a magnetic field that opposes and cancels the magnetic field generated by a current passing through the primary conductor. In some closed loop current sensors, a measure of the secondary conductor current can provide an indication of the level of the current passing through the primary conductor.

Various parameters characterize the performance of magnetic field sensors and magnetic field sensing elements. With regard to magnetic field sensing elements, the parameters include sensitivity, which is the change in the output signal of a magnetic field sensing element in response to a change in a magnetic field, and linearity, which is the degree to which the output signal of a magnetic field sensor varies linearly (i.e., in direct proportion) with respect to the magnetic field.

SUMMARY

In accordance with the concepts, systems, methods and techniques described herein, a current sensor is provided having multiple sensor arrangements to provide multiple, different sensitivity ranges depending on a magnetic field intensity. The outputs of the multiple sensor arrangements can be combined to generate a single output signal.

The present application provides an accurate and coreless measurement of a current flowing through a conductor using a current sensor configured to sense the current in two or more current ranges. For example, the conductor can be integrated in a printed circuit board (PCB) with the current sensor soldered on the same PCB, or a stand-alone bus bar.

The current sensor can include multiple sensitivity ranges, such as but not limited to a first sensitivity range and a second, different sensitivity range. In some embodiments, the first sensitivity range can include a low current measurement range in which the signal to noise ratio is close to a maximum but saturating at higher currents and the second sensitivity range can include a higher current measurement range in which the immunity to common mode field is higher and the closed-loop consumption is reduced. In some embodiments, the current sensor can include more than two sensitivity ranges. For example, the current sensor can be configured to measure one or more intermediate current ranges, between the first sensitivity range (i.e., low current measurement range) and the second sensitivity range (i.e., high current measurement range).

The current sensor can include a first sensor arrangement having one or more magnetic field sensing elements and a second sensor arrangement having one or more magnetic field sensing elements. The magnetic field sensing elements of both the first and second sensor arrangements can include one or more of magnetoresistance elements. For example, in some embodiments, the current sensor can include a giant magnetoresistance (GMR) stack having multiple GMR elements. The GMR stack can be a dual spin valve to provide a symmetric response and an acceptable linear range within a predetermined range. The internal biasing of the layers (e.g., free layers) of the GMR stack can be low to provide a higher sensitivity.

In some embodiments, the current sensor can include multiple magnetoresistance elements on the same die.

Different properties of the sensor arrangements can be modified to change a sensitivity of the respective sensor arrangement. For example, one or more of a shape anisotropy property, shielding property, a spacing between magnetic field sensing elements of the respective sensor arrangement and/or a stack property can be modified to change a sensitivity of the respective sensor arrangement.

The different sensor arrangements can be provided having one or more different shape anisotropy properties. For example, the different sensor arrangements can be provided having a variety of different shapes, such as but not limited to, a yoke shape. In some embodiments, the current sensor can include a first sensor arrangement having a first width (e.g., first yoke width) and a second sensor arrangement having a second, different width (e.g., second yoke width). In one embodiment, a larger width can be used for a lower current measurement range and a smaller or narrower yoke width can be used for a higher current measurement range.

The different sensor arrangements of the current sensor can be formed having a closed-loop configuration. For example, each of the sensor arrangements can include a secondary conductor in proximity to the respective sensor arrangement.

In some embodiments, a coupling ratio between the conductor and the different sensor arrangements can be different. The first sensor arrangement can be configured to sense a lower current measurement range and have a first high coupling ratio with respect to the conductor. The magnetic field to be compensated for by the closed loop configuration is adapted for low currents in the conductor and therefore, the first coupling ratio between the conductor and the first sensor arrangement can be large. The second sensor arrangement can be configured to sense a higher current measurement range and have a second lower coupling ratio with respect to the conductor. The magnetic field to be compensated for by the closed loop configuration of the second sensor arrangement is comparable to the first sensor arrangement. Thus, the second coupling ratio between the conductor and the second sensor arrangement can be lower or reduced as compared to the first coupling ratio between the conductor and the first sensor arrangement.

The outputs of the different sensor arrangements can be combined to generate a single output signal for the current sensor. A saturation coefficient and complement saturation coefficient can be generated to combine the outputs (e.g., first and second magnetic field signals) of the different sensor arrangements. For example, the saturation coefficient can be generated using at least one of the outputs from the different sensor arrangements and the complement saturation coefficient can be generated from the saturation coefficient. The saturation coefficient can be applied to a first magnetic field signal, corresponding to an output of a first sensor arrangement, to generate a first current range signal and the complement saturation coefficient can be applied to a second magnetic field signal, corresponding to an output of a second sensor arrangement, to generate a second current range signal. The first and second current range signals can be combined to generate an output for the current sensor that is indicative of the current through the conductor.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The foregoing features may be more fully understood from the following description of the drawings in which like reference numerals indicate like elements:

FIG. 6 illustrates the layers of a magnetoresistance element having a double (or dual) spin valve stack;

DETAILED DESCRIPTION

Figure 1:
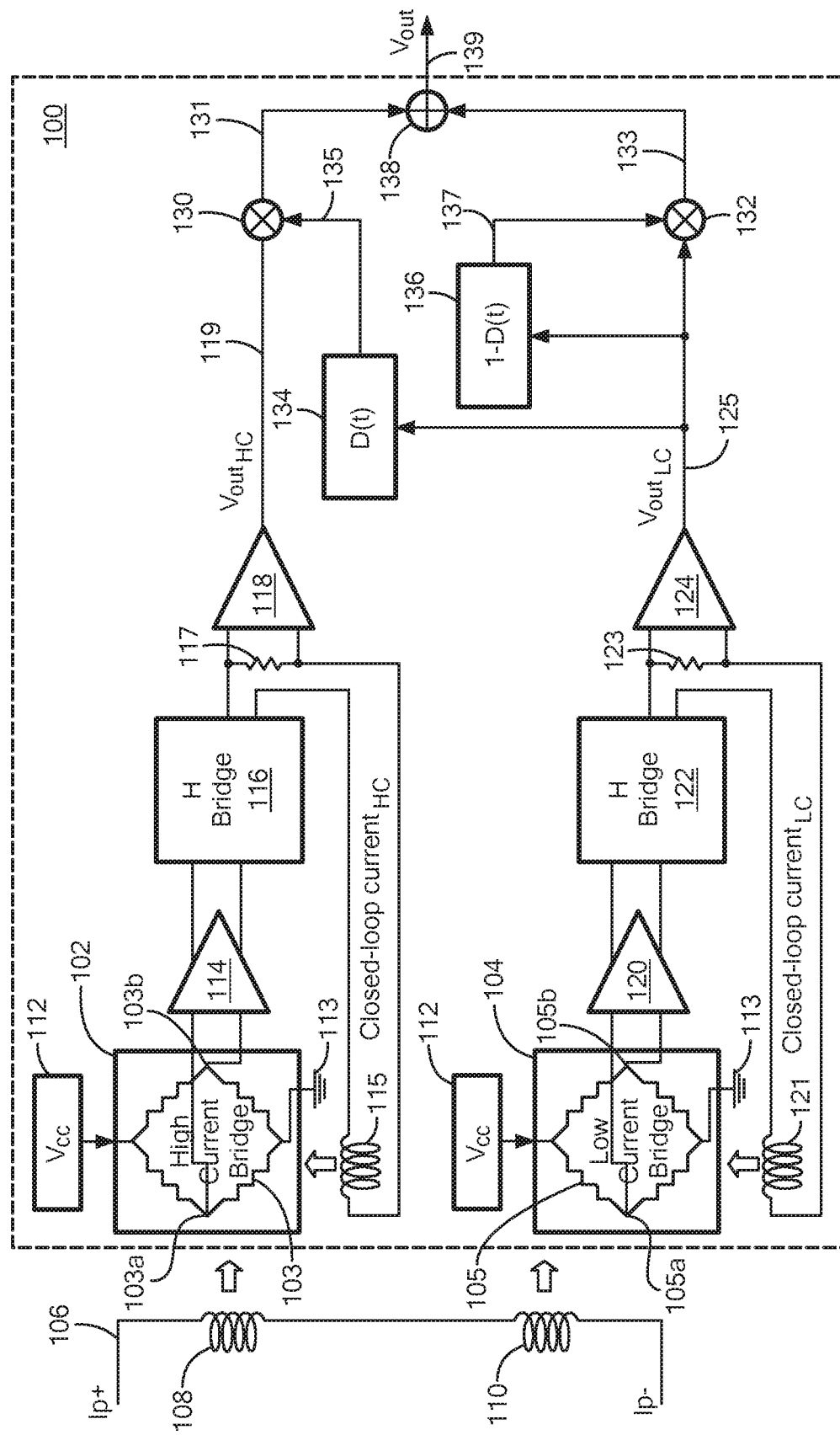
FIG. 1 shows a circuit diagram of a current sensor.

Referring to FIG. 1, a current sensor 100 includes a first sensor arrangement 102 and a second sensor arrangement 104 disposed proximate to a conductor 106. First sensor arrangement 102 may include at least two spaced magnetic field sensing elements and second sensor arrangement 104 may include at least two spaced magnetic field sensing elements. For example, first sensor arrangement 102 may include a first bridge configuration 103 having two or more magnetic field sensing elements and second sensor arrangement 104 may include a second bridge configuration having 105 having two or more magnetic field sensing elements.

In the illustrative embodiment of FIG. 1, first and second bridge configurations 103, 105 include four magnetoresistance elements coupled in a bridge configuration, such as a Wheatstone bridge. For example, magnetoresistance elements of each of first and second bridge configurations 103, 105 may be coupled such that each leg of the bridge includes two magnetoresistance elements positioned adjacent to one another, with one such leg spaced from the other leg.

With this arrangement, a differential output signal of the bridge (taken between intermediate nodes 103a, 103b, 105a, 105b of each bridge leg) may result in a differential signal that rejects stray fields from sources other than the current through the conductor 106. The magnetoresistance elements may include at least one of a giant magnetoresistance (GMR) element, an anisotropic magnetoresistance (AMR) element, a tunneling magnetoresistance (TMR) element or a magnetic tunnel junction (MTJ) element. It should be appreciated that, in some embodiments, magnetic field sensing elements may be provided as one or more Hall effect elements.

First and second sensor arrangements 102, 104 may be disposed proximate to different portions of conductor 106. For example, first sensor arrangement 102 is disposed proximate to a first portion 108 of conductor 106 and second sensor arrangement 104 is disposed proximate to a second, different portion 110 of conductor 106.

First and second sensor arrangements 102, 104 can be configured to sense a current through conductor 106 at first and second portions 108, 110 respectively and generate output signals (e.g., first and second magnetic field signals, respectively) corresponding to the current through conductor 106 at first and second portions 108, 110. In an embodiment, first and second sensor arrangements 102, 104 can be configured to sense a magnetic field in different measurement ranges corresponding to different ranges of currents through conductor 106. For example, first sensor arrangements 102 can be configured to sense a magnetic field in a first measurement range corresponding to a first range of currents through conductor 106 and second sensor arrangements 104 can be configured to sense a magnetic field in a second measurement range corresponding to a second range of currents through conductor 106. In some embodiments, the first measurement range may correspond to a higher current range and the second measurement range may correspond to a lower current range. In other embodiments, the first measurement range may correspond to a lower current range and the second measurement range may correspond to a higher current range. In a first example embodiment, the low current range can be between approximately 20 mA to 1 A and the high current range can be between approximately 1 A and 100 A. In a second example embodiment, the low current range can be between approximately 0 A to 40 mA and the high current range can be between approximately 40 mA to 1 A in the second embodiment.

As illustrated in FIG. 1, first and second sensor arrangements 102, 104 are coupled to a supply voltage 112 and a reference terminal 113 (e.g., ground terminal).

Referring now to first sensor arrangement 102, first sensor arrangement 102 can generate a differential magnetic field signal for coupling to a first differential amplifier 114 though first and second nodes 103*a*, 103*b*. One or more outputs of first amplifier 114 are coupled to one or more inputs of a first H bridge circuit 116. First H bridge circuit 116 can include multiple field effect transistors coupled together to compare two input signals and remove or reduce noise and/or interference (e.g., DC offset) and in some embodiments, apply a gain to the difference between the two input signals.

A first feedback coil 115 can be positioned proximate to first sensor arrangement 102 in order to apply an equal and opposite field to the sensing elements to drive the differential field on the bridge to approximately zero Gauss. The current through first coil 115 necessary to bring the differential field on the sensing elements of first sensor arrangement 102 to zero is sensed by a first resistor 117 in order to thereby implement a closed loop current sensing system.

A voltage on the first sense resistor 117 is coupled to second amplifier 118. In some embodiments, amplifier 118 can be configured to implement offset and/or gain adjustment, including temperature compensation.

Referring now to second sensor arrangement 104, second sensor arrangement 104 can generate a differential magnetic field signal for coupling to a third differential amplifier 120 though first and second nodes 105*a*, 105*b*. One or more outputs of third amplifier 120 are coupled to one or more inputs of a second H bridge circuit 122. Second H bridge circuit 122 can include multiple field effect transistors coupled together to compare two input signals and remove or reduce noise and/or interference (e.g., DC offset) and in some embodiments, apply a gain to the difference between the two input signals.

A second feedback coil 121 can be positioned proximate to second sensor arrangement 104 in order to apply an equal and opposite field to the sensing elements to drive the differential field on the bridge to approximately zero Gauss. The current through second coil 121 necessary to bring the differential field on the sensing elements of second sensor arrangement 104 to zero is sensed by a second resistor 123 in order to thereby implement a closed loop current sensing system. It should be appreciated that although current sensor 100 is shown to be a closed loop sensor in FIG. 1, in some embodiments, current sensor 100 can be an open loop sensor.

A voltage on the second sense resistor 123 is coupled to a fourth amplifier 124. In an embodiment, fourth amplifier 124 can be configured to implement offset and/or gain adjustment, including temperature compensation.

Amplifier 118 can generate a first magnetic field signal 119 corresponding to a magnetic field signal sensed by first sensor arrangement 102 and indicative of a first range of currents through conductor 106. Amplifier 124 can generate a second magnetic field signal 125 corresponding to a magnetic field signal sensed by second sensor arrangement 104 and indicative of a second range of currents through conductor 106.

The first and second magnetic field signals 119, 125 can be combined to generate an output 139 of the current sensor that corresponds to a level of the current through the conductor. Various schemes are possible to combine the first and second magnetic field signals 119, 125.

In the illustrative embodiment, a saturation coefficient or saturation coefficient function is generated and used to provide the sensor output signal 139, as will be described further below in connection with FIGS. 5-5C. To this end, an output of amplifier 124 is coupled to an input of a first saturation module 134, an input of a second saturation module 136, and a first input of a second mixer or amplifier 132.

First saturation module 134 can receive the second magnetic field signal 125 and generate a saturation coefficient. In some embodiments, the saturation coefficient can vary between two saturation coefficients (e.g., 0 and 1) that are determined based at least in part on a particular application of current sensor 100 and one or more current ranges to be measured. For example, in one embodiment, the saturation coefficients can be selected to cancel output of first sensor arrangement 102 (e.g., output of a high current bridge) and to prevent the injection of noise when measuring the second current range (e.g., measuring the low current range). In some embodiments, first saturation module 134 can generate the saturation coefficient using a comparator and a reference value (or reference threshold).

An output of amplifier 118 is coupled to a first input of a first mixer, or amplifier 130 and an output of first saturation module 134 can be coupled to a second input of first mixer 130. First mixer 130 can be configured to apply the saturation coefficient 135 to first magnetic field signal 119 and generate a first current range signal 131.

Second saturation module 136 can be configured to receive second magnetic field signal 125 and generate a complement saturation coefficient 137. In an embodiment, complement saturation coefficient 137 can be a complement version of saturation coefficient 135.

An output of second saturation module 136 is coupled to a second input of second mixer 132. Second mixer 132 can be configured to apply the complement saturation coefficient 137 to the second magnetic field signal and generate a second current range signal 133.

Outputs of first and second mixers 130, 132 can be coupled to a first input and a second input of third mixer or amplifier 138, respectively, to provide the first and second current range signals 131, 133, respectively. Third mixer 138 can be configured to combine the first current range signal 131 and the second current range signal 133 to generate an output signal 139 corresponding to the current through conductor 106. In an embodiment, output signal 139 can correspond to a combination of the first magnetic field signal 119 and the second magnetic field signal 125.

Figure 2:
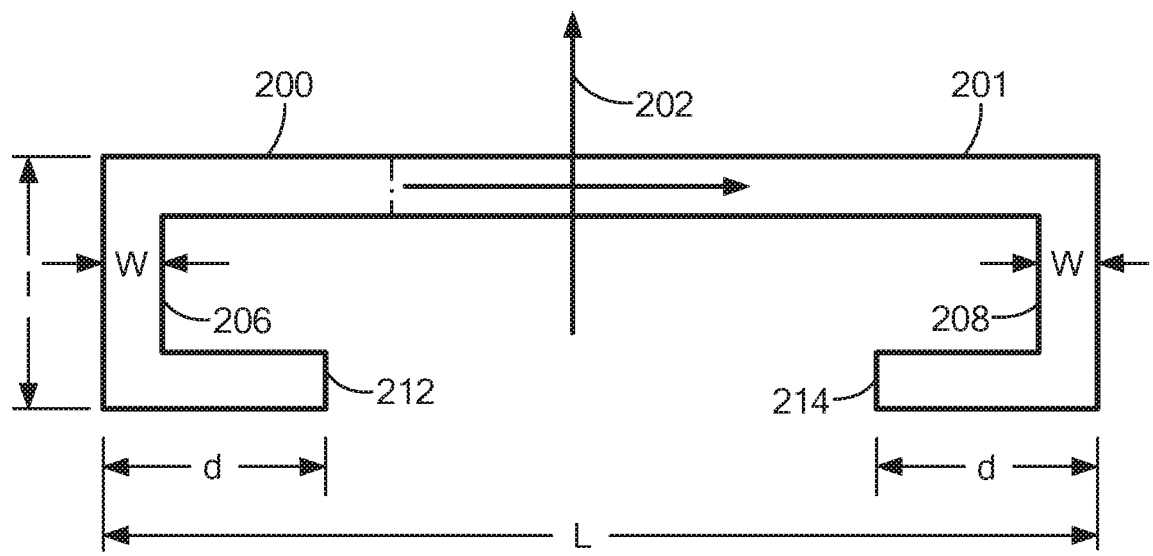
FIG. 2 shows a top view of a magnetic field sensing element having a yoke shape.

Now referring to FIG. 2, a magnetic field sensing element 200 is provided having a yoke shape. Magnetic field sensing element 200 may be the same as or substantially similar to the magnetic sensing elements of first and second bridge configurations 103, 105 of first and second sensor arrangements 102, 104 of FIG. 1.

The magnetic field sensing element 200 has a main part 201, two arms 206, 208 coupled to the main part 201, and two lateral arms 212, 214 coupled to the two arms 206, 208, respectively. In some embodiments, the main part 201, the two arms 206, 208, and the two lateral arms 212, 214 each have a width (W). However, in other embodiments, the widths can be different.

A length (L) of magnetic field sensing element 200 and a length (d) of the lateral arms 212, 214 of magnetic field sensing element 200 can be each at least three times the width (W) of magnetic field sensing element 200, and the width (W) of magnetic field sensing element 200 can be between about one μm and about twenty μm.

The dimensions of magnetic field sensing element 200 can be, for example, within the following ranges:
the length (L) of the main part 201 of magnetic field sensing element 200 can be between about ten μm and ten millimeters;

the length (l) of the arms 206, 208 of magnetic field sensing element 200 can be at least three times the width (W);

the width (W) of magnetic field sensing element 200 can be between about one µm and about twenty µm.

The arms 206, 208 of magnetic field sensing element 200 are linked to the lateral arms 212, 214, which are parallel to the main part 201, and have a length l which is between about ¼ and ⅓ of the overall length (L).

In general, sensitivity of magnetic field sensing element 200 having the yoke shape increases as the width (W) increases and low frequency noise decreases when the width (W) or length (L) increases.

In an embodiment, the yoke shape can offer better magnetic homogeneity in a longitudinally central area of the main part 201. This is due to the demagnetizing field of the yoke length which is mainly along the main part 201, and this induces an anisotropy of the free layer magnetic field sensing element 200, which can be seen as a magnetization at zero field along the length of magnetic field sensing element 200. If the pinned layer has a magnetic field perpendicular to magnetic field sensing element 200 (e.g., arrow 202), when an external field is applied in direction of the arrow 202, the free layer magnetization rotates uniformly, i.e. without domain jumps. The homogeneous rotation of the magnetization of the free layer results in a response curve without steps in the response.

The magnetoresistance element 200 can take the form of at least one of a giant magnetoresistance (GMR) element, an anisotropic magnetoresistance (AMR) element, a tunneling magnetoresistance (TMR) element or a magnetic tunnel junction (MTJ) element.

For a GMR element, the overall stack can be designed in a yoke shape, but for a TMR element, in some embodiments, only the free layer can have a yoke shape. Although magnetic field sensing element 200 is shown in FIG. 2 having a yoke shape, it should be appreciated that in other embodiments magnetic field sensing element 200 can be formed having a variety of different shapes. For example, in some embodiments, magnetic field sensing element 200 can be formed having the shape of a straight bar (e.g., having the dimensions L and w, and not having features associated with the dimensions l and d).

One or more properties of the magnetic field sensing elements used in a current sensor (e.g., sensor 100 of FIG. 1) can be modified to provide different sensitivities. For example, magnetic field sensing elements in the first and second sensor arrangements (e.g., 102, 104 of FIG. 1) can differ from each other in one or more of a shape anisotropy property, a shielding property, a spacing between the respective magnetic field sensing elements, and/or a stack property. In an embodiment, the particular properties of the magnetic field sensing elements in a sensor arrangement can be selected based at least in part on a desired measurement range (e.g., current range to be measured).

Figure 2A:
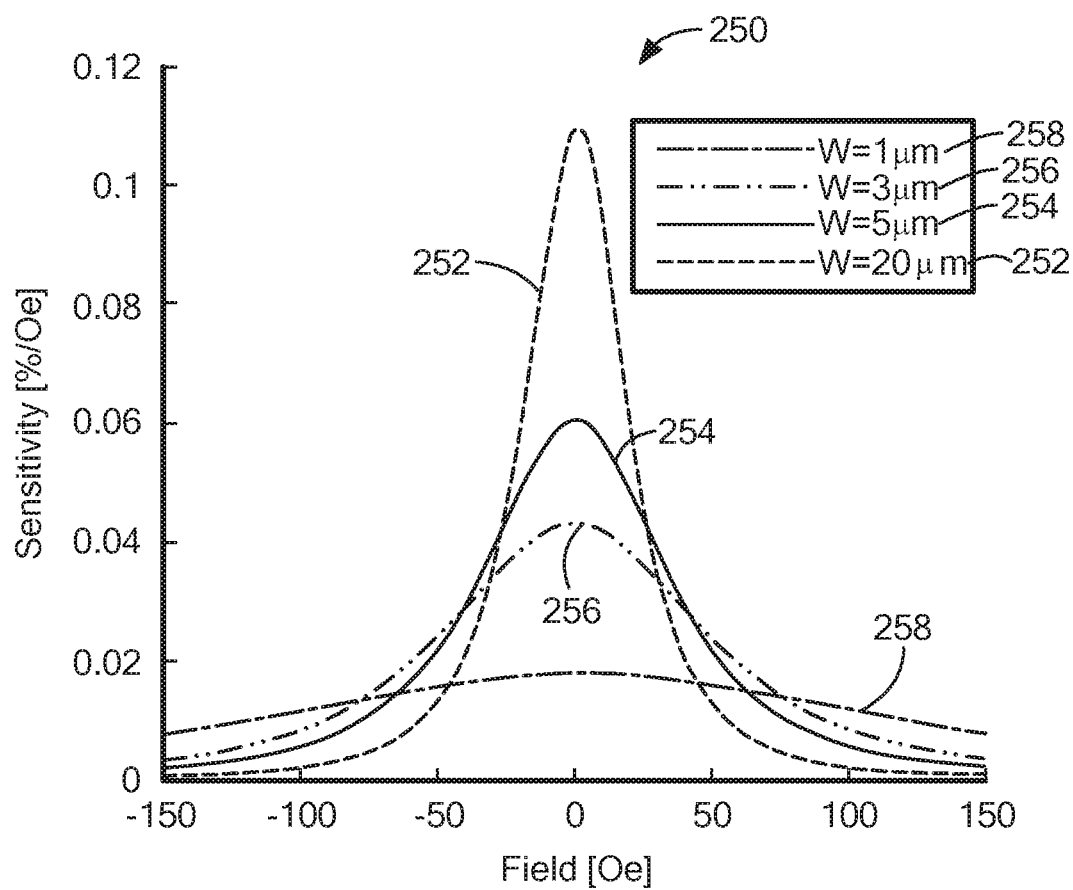
FIG. 2A shows a plot comparing the sensitivities of magnetic sensing elements having different widths.

Now referring to FIG. 2A, a plot 250 is provided comparing the sensitivities of magnetic field sensing elements having different widths, with the vertical axis (e.g., y-axis) corresponding to sensitivity values in units of sensitivity percentage per oersted (%/Oe) units and the horizontal axis (e.g., x-axis) corresponding to magnetic field values in oersted (Oe) units. In an embodiment, magnetic field sensing elements having different widths can be used to sense different measurement ranges. For example, magnetic field sensing elements having a greater (or larger) width can be used to measure low current ranges as they have higher sensitivity. Further, magnetic field sensing elements having a smaller (or narrow) width can be used to measure higher current ranges as they have a lower sensitivity and higher stray field immunity.

In plot 250, first waveform 252 corresponds to the sensitivity of a magnetic field sensing element having a first width, second waveform 254 corresponds to the sensitivity of a magnetic field sensing element having a second width, third waveform 256 corresponds to the sensitivity of magnetic field sensing element having a third width, and fourth waveform 258 corresponds to the sensitivity of a magnetic field sensing element having a fourth width. In an embodiment, each of the first, second, third and fourth widths are different. For example, first width can be greater than the second, third and fourth widths, second width can be greater than the third and fourth widths, and third width can be greater than the fourth width. In one embodiment, the first width may be approximately 20 µm, the second width may be approximately 5 µm, the third width may be approximately 3 µm, and the fourth width may be approximately 1 µm. However, it should be appreciated that the width of a particular magnetic field sensing element can vary and be selected based at least in part on a particular application of a current sensor.

As illustrated in plot 250, as the width of a magnetic field sensing element increases the sensitivity of the magnetic field sensing element increases and as the width of a magnetic field sensing element decreases the sensitivity of the magnetic field sensing element decreases. For example, first waveform 252 corresponds to a magnetic field sensing element having the greatest width as compared to waveforms 254, 256, 258 and thus, first waveform 252 has the highest sensitivity value. Fourth waveform 258 has the smallest width as compared to waveforms 252, 254, 256 and thus, fourth waveform 258 has a smaller sensitivity value than each of waveforms 252, 254, 256.

Thus, depending on a desired current range to be measured, sensor arrangements can be formed and provided having magnetic field sensing elements with different widths, such that a first sensor arrangement can sense a magnetic field in a first measurement range and a second sensor arrangement can sense a magnetic field in a second measurement range. The width of a particular magnetic field sensing element can be selected based on a particular application of the current sensor and the one or more current ranges to be measured.

Figure 3:
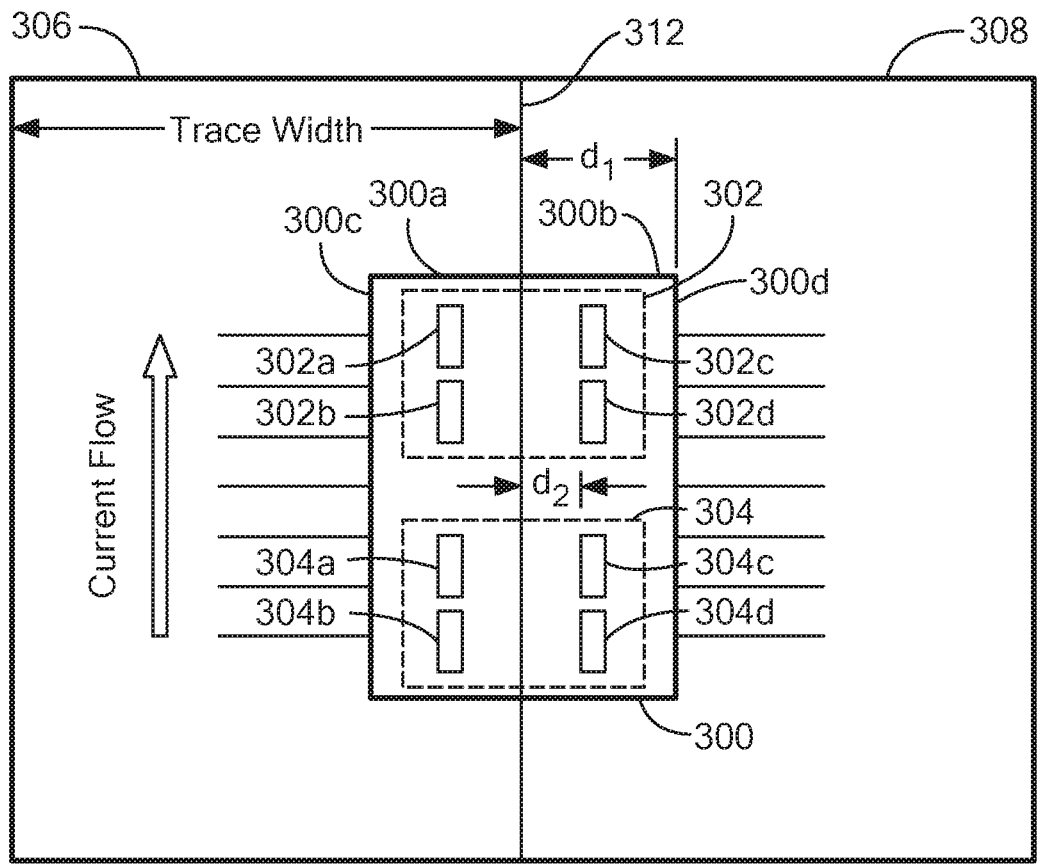
FIG. 3 shows the spacing of one or more magnetic field sensing elements within the current sensor of FIG. 1 relative to the conductor.

Referring now to FIG. 3, current sensor 300 can be positioned over edge 312 of conductor 306 such that a first sensor arrangement 302 is vertically aligned with (here over) conductor 306 and a second sensor arrangement 304 is not vertically aligned with conductor 306 and instead is aligned with a non-current carrying surface 308 (i.e., with first and second sensor arrangements 302, 304 straddling the edge 312 of the conductor). In an embodiment, current sensor 300, first and second sensor arrangements 302, 304 and conductor 306 can be the same as or substantially similar to current sensor 100, first and second sensor arrangements 102, 104, and conductor 106 of FIG. 1 respectively.

First and second sensor arrangements 302, 304 can include one or more magnetic field sensing elements. For example, and as illustrated in FIG. 3, first sensor arrangement 302 includes first, second, third and fourth magnetic field sensing elements 302a-302d and second sensor arrangement 304 includes first, second, third and fourth magnetic field sensing elements 304a-304d, each spaced a predetermined distance d2 from edge 312.

Current sensor 300 can be configured such that each of first and second sensor arrangements 302, 304 senses a gradient between the magnetic field sensed by elements within the respective first and second sensor arrangements 302, 304. For example, the first sensor arrangement 302 can generate a magnetic field signal indicative of a difference between the magnetic field experienced by elements 302a, 302b and the magnetic field experienced by elements 302c, 302d. Similarly, the second sensor arrangement 304 can generate a magnetic field signal indicative of a difference between the magnetic field experienced by elements 304a, 304b and the magnetic field experienced by elements 304c, 304d. Thus, the sensing methodology requires a difference (or gradient) in the magnetic fields experienced by the sensing elements 302a, 302b, 304a, 304b and experienced by the sensing elements 302c, 302d, 304c, 304d.

The position of current sensor 300 relative to conductor 306 can be selected based at least in part on a level of the current through conductor 306 and thus, the expected magnetic field strength, the sensitivity of the magnetic field sensing elements, and/or a magnetic field gradient to be measured. In some embodiments, it may be desirable to position the sensor 300 so that the first and second sensor arrangements 302, 304 experience the largest magnetic field gradient possible (i.e., the largest difference between the magnetic fields experienced by the spaced magnetic field sensing elements in each bridge) as may occur when in each bridge at least one first magnetic field sensing element is vertically aligned with the current carrying conductor 306 and at least one second magnetic field sensing element is not vertically aligned with the current carrying conductor 306. To this end, a first portion 300a of current sensor 300 is vertically aligned with (here over) conductor 306 and a second portion 300b is not vertically aligned with conductor 306 and instead is vertically aligned with a non-current carrying surface 308. In one such configuration, current sensor 300 may be positioned such that an edge 300c of first portion 300a and an edge 300d of second portion 300b are equidistant from edge 312 of conductor 306, here represented by a distance "d1" (and, in some embodiments, such that the sensing elements 302a-302d, 304a-304d are equidistant from the conductor edge 312, here represented by a distance "d2"). Thus, first portion 300a and second portion 300b can be equal in size (e.g., width, length).

In other embodiments, first portion 300a and second portion 300b may be different in size. For example, current sensor 300 may be positioned such a distance from edge 312 of conductor 306 to edge 300c of first portion 300a is greater than a distance from edge 312 of conductor 306 to edge 300d of second portion 300b. In such configurations, the magnetic field sensing elements 302a-302d, 304a-304d may not be equidistantly spaced from the conductor edge 312.

In some embodiments, all of current sensor 300 (or at least both first and second sensor arrangements 302, 304) may be vertically aligned (i.e., positioned over) conductor 306. In such embodiments, the sensing elements 302a-302d, 304a-304d of first and second sensor arrangements 302, 304 are not centered with respect to the conductor 306 in order to ensure a gradient in the magnetic fields experienced by the sensing elements. In other embodiments, current sensor 300 can be positioned relative to conductor 306 such no portion (or at least none of sensing elements 302a-302d, 304a-304d of first and second sensor arrangements 302, 304) is vertically aligned (i.e., positioned over) conductor 306 and instead current sensor 300 is vertically offset with respect to conductor 306.

It should be appreciated that although first and second sensor arrangements 302, 304 are shown to include four magnetic field sensing elements 302a-302d, 304a-304d, respectively in FIG. 3, in other embodiments, first and second sensor arrangements 302, 304 (or any current sensor described herein) may include less than four magnetic field sensing elements or more than four magnetic field sensing elements.

Figure 4:
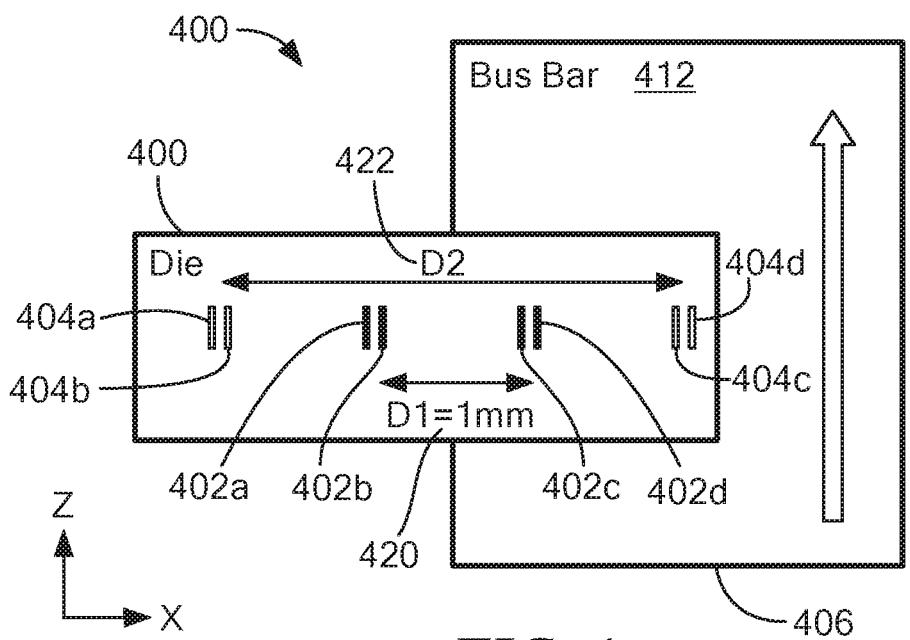
FIG. 4 shows the current sensor of FIG. 1 positioned over an edge of a conductor and having two sensor arrangements.

Now referring to FIG. 4, a current sensor 400 is positioned over an edge 412 of a conductor 406. Current sensor 400 includes a first sensor arrangement 402 having first, second, third and fourth magnetic field sensing elements 402a-402d and a second sensor arrangement 404 having first, second, third and fourth magnetic field sensing elements 404a-404d, each disposed on the same die. In an embodiment, conductor 406 can be integrated in a printed circuit board (PCB) with current sensor 400 soldered on the same PCB, or a stand-alone bus bar.

In an embodiment, current sensor 400, first and second sensor arrangements 402, 404 and conductor 406 can be the same as or substantially similar to current sensor 100, first and second sensor arrangements 102, 104, and conductor 106 of FIG. 1 respectively.

The magnetic field sensing elements 402a-402d of first sensor arrangement 402 can be spaced from each other by a different distance than magnetic field sensing elements 404a-404d of second sensor arrangement 404 to provide the ability to measure different current ranges of a current through conductor 406. For example, and as illustrated in FIG. 4, first sensor arrangement 402 is positioned such that it straddles edge 412 of conductor 406. First sensor arrangement 402 includes a first pair of magnetic field sensing elements 402a, 402b not positioned over conductor 406 and a second pair of magnetic field sensing elements 402c, 402d positioned over conductor 406. First pair 402a, 402b is spaced a first distance 420 from second pair 402c, 402d. In an embodiment, first pair 402a, 402b is spaced the same distance from edge 412 as second pair 402c, 402d. In other embodiments, first pair 402a, 402b can be spaced a different distance from edge 412 than second pair 402c, 402d.

Second sensor arrangement 404 is also positioned such that it straddles edge 412 of conductor 406. For example, second sensor arrangement 404 includes a first pair of magnetic field sensing elements 404a, 404b not positioned over conductor 406 and a second pair of magnetic field sensing elements 404c, 404d positioned over conductor 406. First pair 404a, 404b is spaced a second distance 422 from second pair 404c, 404d. In an embodiment, first pair 404a, 404b is spaced the same distance from edge 412 as second pair 404c, 404d. In other embodiments, first pair 404a, 404b can be spaced a different distance from edge 412 than second pair 404c, 404d.

The first distance 420 between the first pair of elements 402a, 402b and the second pair of elements 402c, 402d of first sensor arrangement 402 can be different (e.g., less than, greater than) than the second distance 422 between the first pair of elements 404a, 404b and the second pair of elements 402c, 402d of second sensor arrangement 404. Thus, first sensor arrangement 402 can be configured to sense a magnetic field in a first measurement range corresponding to a first range of currents through conductor 406 and second sensor arrangement 404 can be configured to sense a magnetic field in a second, different measurement range corresponding to a second, different range of currents through conductor 406.

The different spacing between first and second pairs 402a-402d of first sensor arrangement 402 and first and second pairs 404a-404d of second sensor arrangement 404, can provide different coupling ratios for the first and second sensor arrangements 402, 404. The different coupling ratios can provide different levels of sensitivity. The coupling ratio of a sensor arrangement refers to the amount of differential field generated on the elements of the respective sensor arrangement by the current to be measured. For example, first sensor arrangement 402 can be configured to sense a higher current measurement range and have a first coupling ratio with respect to conductor 406 and the second sensor arrangement 404 can be configured to sense a lower current measurement range and have a second coupling ratio with respect to conductor 406. The magnetic field to be compensated for by the closed loop configuration of the first sensor arrangement can be larger than the second sensor arrangement. Thus, the first coupling ratio between conductor 406 and the first sensor arrangement 402 can be lower or reduced as compared to the second coupling ratio between conductor 406 and the second sensor arrangement 404. For example, the magnetic field to be compensated for by the closed loop configuration of the second sensor arrangement can be smaller and therefore, the second coupling ratio between conductor 406 and the second sensor arrangement 404 can be larger.

Figure 4A:
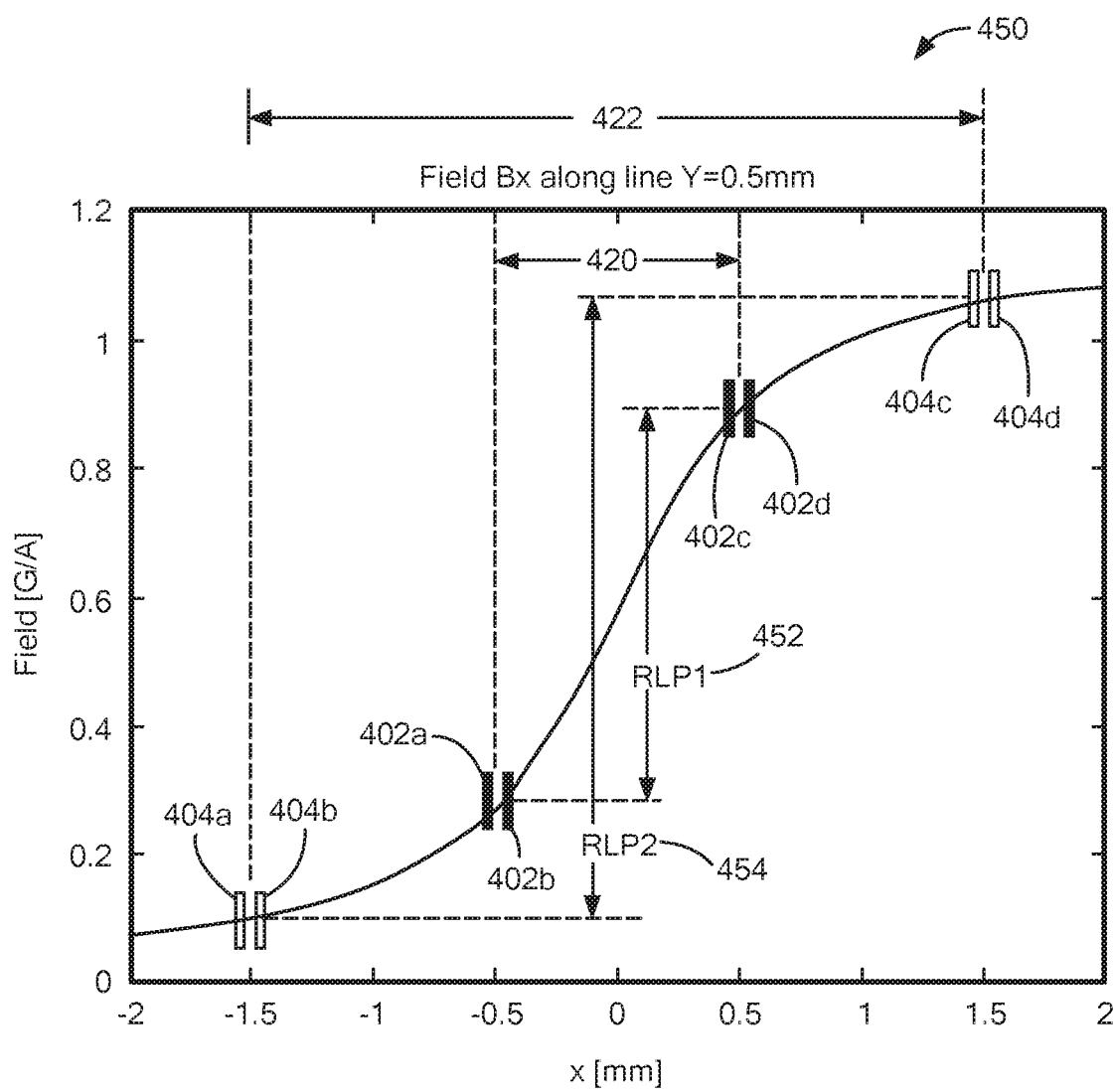
FIG. 4A shows a plot comparing the coupling ratios of different sensor arrangements based on a distance from the conductor for each of the respective sensor arrangements.

Now referring to FIG. 4A, a plot 450 compares a first coupling ratio 452 for the first sensor arrangement 402 of FIG. 4 to a second coupling ratio 454 for the second sensor arrangement 404 of FIG. 4, with the vertical axis (e.g., y-axis) corresponding to a magnetic field density per amps through a conductor (G/A) and the horizontal axis (e.g., x-axis) corresponding to a distance value, here in millimeters, between magnetic field sensing elements.

In plot 450, the first element pair 402a, 402b of first sensor arrangement 402 are spaced a first distance 420 from the second element pair 402c, 402d of first sensor arrangement 402, resulting in a first coupling ratio 452. Further, the first element pair 404a, 404b of second sensor arrangement 404 are spaced a second distance 422 from the second element pair 404c, 404d of second sensor arrangement 404, resulting in a second coupling ratio 454.

The coupling ratios 452, 454 (e.g., Rcp [G/A]) correspond to the amount of differential field generated on the sensing elements of the first and second sensor arrangements 402, 404 by the current through conductor 406 to be measured. Thus, first and second sensor arrangements 402, 404 can be formed to have different coupling ratios, here first and second coupling ratios 452, 454, respectively, to sense a magnetic field in different measurement ranges.

For example, the first sensor arrangement (e.g., high current bridge), the maximum field to be sensed can be high and therefore, the coupling ratio between first pair 402a, 402b and second pair 402c, 402d can be small to reduce current needed in the closed-loop configuration (e.g., lower consumption). For the second sensor arrangement 404 (e.g., low current bridge), the maximum field to be sensed can be low and therefore, the coupling ratio between first pair 404a, 404b and second pair 404c, 404d can be large without requiring too much current from the closed-loop configuration (e.g., higher front-end sensitivity).

Figure 5:
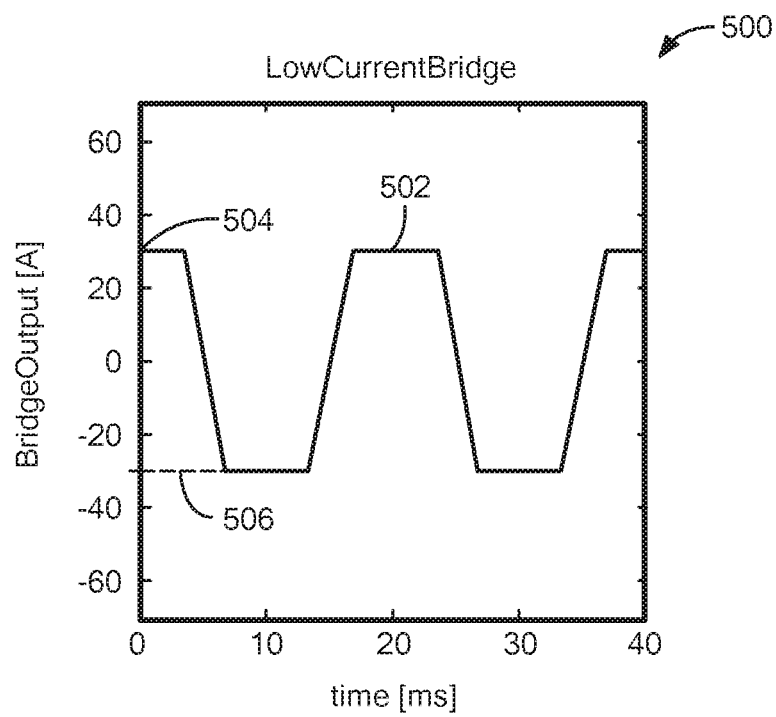
FIG. 5 shows a plot illustrating the output signal of a sensor arrangement (e.g., low current bridge) of the current sensor of FIG. 1.

Now referring to FIG. 5, a plot 500 shows an output signal 502 of a second sensor arrangement (e.g., low current bridge) of the current sensor of FIG. 1 with the vertical axis (e.g., y-axis) corresponding to the output signal value (amps) and the horizontal axis (e.g., x-axis) corresponding to a time value, here milliseconds (ms). In an embodiment, the second sensor arrangement may be the same as or substantially similar to second sensor arrangement 104 of FIG. 1 and output signal 502 may correspond to the second magnetic field signal 125.

In an embodiment, the second sensor arrangement can correspond to a low current bridge and be configured to saturate or otherwise plateau at one or more thresholds values when the current being sensed by the second sensor arrangement is greater than or exceeds one or more respective thresholds. For example, and as illustrated in plot 500, the second sensor arrangement (e.g., low current bridge) can be configured to saturate or plateau when the current measured is greater than a first threshold value 504 (e.g., 30 amps) and/or a second threshold value 506 (e.g., −30 amps).

Figure 5A:
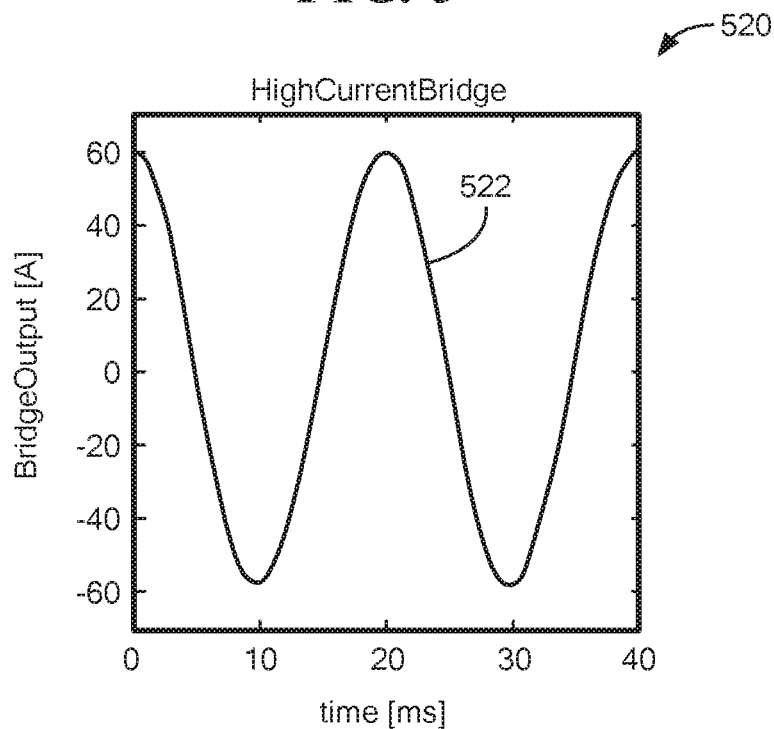
FIG. 5A shows a plot illustrating the output signal of a sensor arrangement (e.g., high current bridge) of the current sensor of FIG. 1.

Now referring to FIG. 5A, a plot 520 shows an output signal 522 of a first sensor arrangement (e.g., high current bridge) of the current sensor of FIG. 1 with the vertical axis (e.g., y-axis) corresponding to the output signal value (amps) and the horizontal axis (e.g., x-axis) corresponding to a time value, here milliseconds (ms). In an embodiment, the first sensor arrangement may be the same as or substantially similar to first sensor arrangement 102 of FIG. 1 and output signal 522 may correspond to the first magnetic field signal 119.

The first sensor arrangement can correspond to a high current bridge and therefore, its respective output signal 522 does not saturate at a particular threshold value. For example, and as illustrated in plot 520, output signal 522 does not saturate or plateau in the presence of fields generated by currents of +/−60 amps through the conductors.

In an embodiment, output signals 502, 522 generated by respective second and first sensor arrangements can be combined to generate an output signal, such as but not limited to output signal 139 of current sensor 100. To combine output signals 502, 522, a saturation coefficient can be applied to at least one of the output signals 502, 522.

Figure 5B:
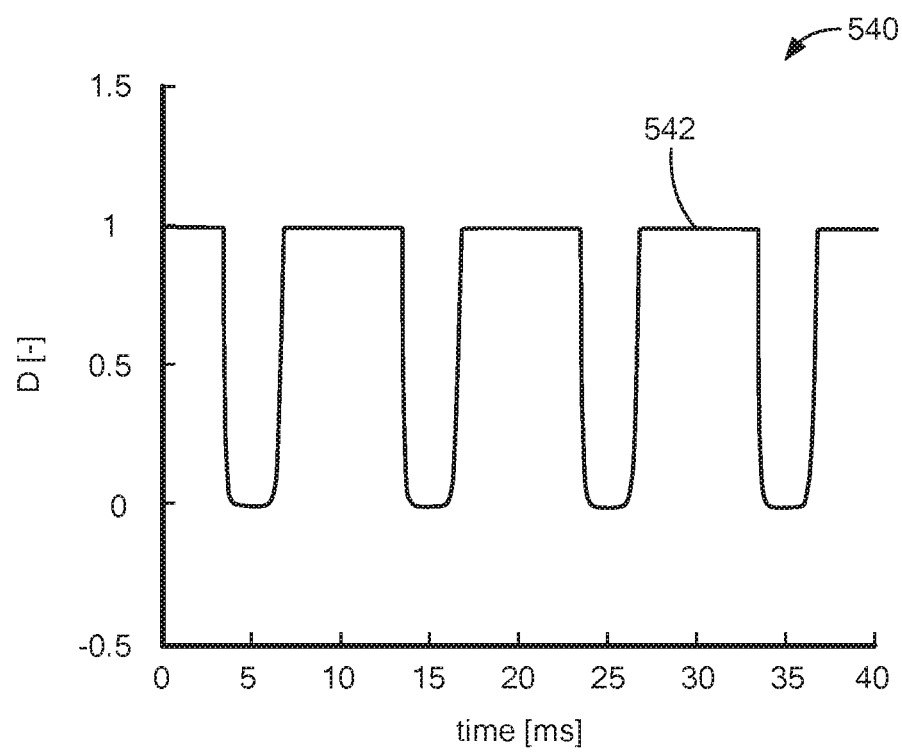
FIG. 5B shows a plot illustrating a saturation coefficient.

Now referring to FIG. 5B, a plot 540 shows a saturation coefficient, or saturation coefficient function 542. In an embodiment, saturation coefficient 542 can be used with outputs 502, 522 of second and first sensor arrangements to generate an output signal, such as but not limited to output signal 139 of current sensor 100. More particularly, the saturation coefficient 542 can be applied to the first magnetic field signal 522 (FIG. 5A) and a complement version of the saturation coefficient can be applied to the second magnetic field signal 502 (FIG. 5).

The saturation coefficient 542 can be calculated using one of the outputs of at least one of the sensor arrangements of the current sensor. For example, in some embodiments, the saturation coefficient 542 can be generated using the output signal 502 of the second sensor arrangement (e.g., low current bridge). The value of the saturation coefficient 542 can vary between two saturation coefficients (here, 0 and 1) that are determined based at least in part on a particular application of current sensor 100 and one or more current ranges to be measured. In an embodiment, the saturation coefficient 542 can be configured to cancel the high current bridge output, here output signal 522 of first sensor arrangement, and to prevent the injection of noise when measuring low currents.

The saturation coefficient (D(t)) can be determined using the following formula.

$$D(t) = \exp\left(\frac{BridgeOutput_{LC}(t)}{I_{mean}} - 1\right)^{12}$$

Where $BridgeOutput_{LC}$ is the output value of the low current bridge and $I_{mean}$ is a fixed coefficient. The selection of the $I_{mean}$ value will depend on the application. In general, $I_{mean}$ should be above the detection limit of the high current bridge and low enough to limit the consumption of the low current closed-loop. The saturation coefficient 542 can be configured to limit the differences in values (e.g., jumps) at interfaces between the two output signals 502, 522 to provide a reconstructed output signal that is a combination of both output signals 502, 522.

Figure 5C:
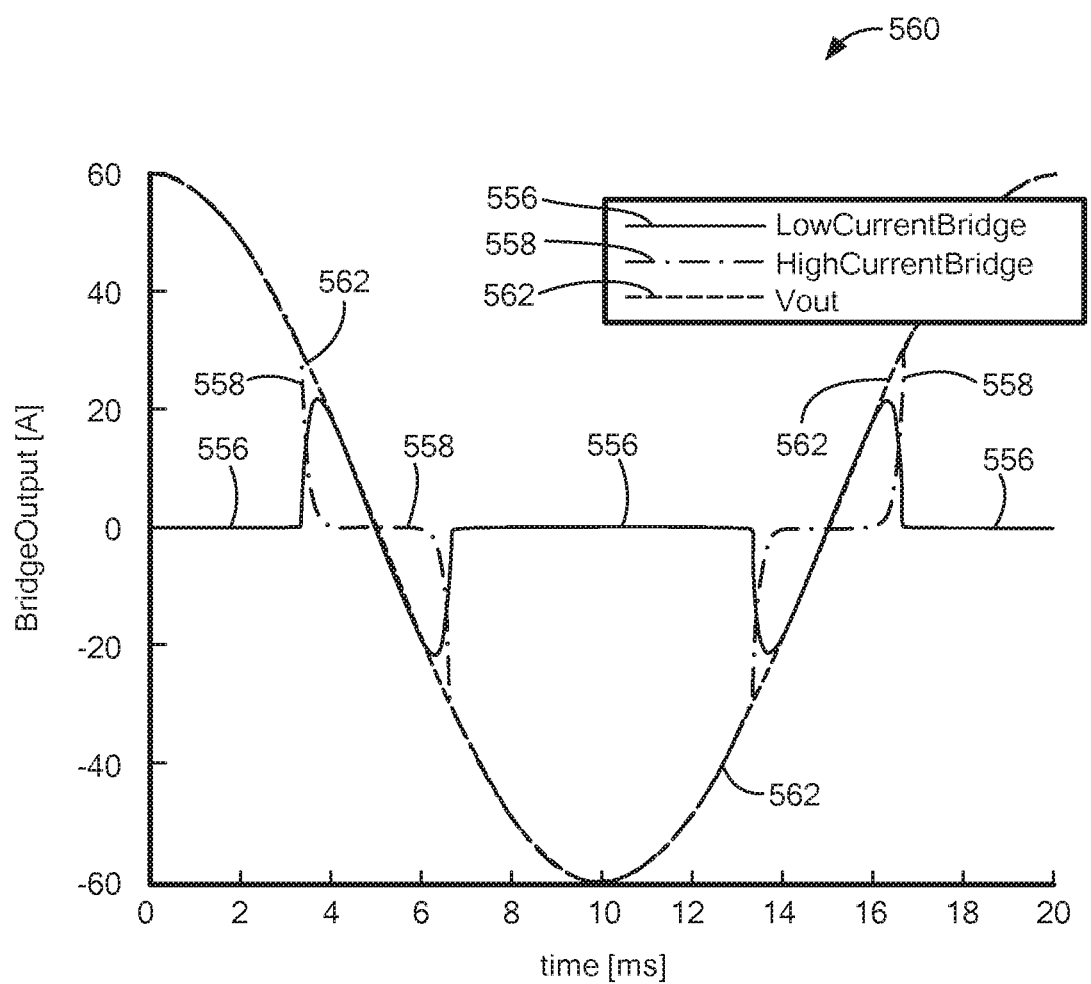
FIG. 5C shows a plot of the output signal of the first sensor arrangement, the output signal of the second sensor arrangement, and the output signal of the current sensor of FIG. 1.

Now referring to FIG. 5C, a plot 560 illustrates an output signal 556 of the first sensor arrangement (e.g., signal 522 of FIG. 5A multiplied by the saturation coefficient D(t)), an output signal 558 of the second sensor arrangement (e.g., signal 502 of FIG. 5 multiplied by the complement of the saturation coefficient 1−D(t)), and the output signal 562 of a current sensor (e.g., current sensor 100 of FIG. 1). In an embodiment, output signal 562 may be the same as or substantially similar to output signal 139 of current sensor 100 of FIG. 1.

The output signal 562 ($V_{out}(t)$) can be determined using the following formula:

$$V_{out}(t)=D(t)*\text{BridgeOutput}_{HC}(t)+(1-D(t))*\text{BridgeOutput}_{LC}(t)$$

Where D(t) is the saturation coefficient, $\text{BridgeOutput}_{HC}$ is the output value of the high current bridge, and $\text{BridgeOutput}_{LC}$ is the output value of the low current bridge.

As illustrated in plot 560, output signal 562 is a combination of the output signal 502 of the second sensor arrangement multiplied by the complement of the saturation coefficient and the output signal 522 of the first sensor arrangement multiplied by the saturation coefficient.

Now referring to FIG. 6, a dual spin valve magnetoresistance element 600, as may be used to provide one or more magnetic field sensing elements of current sensor 100 for example, includes a first portion 602 corresponding to a double pinned magnetoresistance element and a second portion 604 corresponding to a reversed double pinned magnetoresistance element. A common antiferromagnetic pinning layer 606 can be formed between first portion 602 and second portion 604.

The dual spin valve magnetoresistance element 600 can have two free layer structures, for which spacer layers 608, 610 have different thicknesses selected to result in different couplings to the two free layer structures so that the two free layer structures have magnetic fields with opposite directions as shown. The directions of the magnetic fields in the two free layer structures can be reversed from the direction shown.

In some embodiments, a first spacer layer 608 has a thickness that can be in one of two example ranges. e.g., about 1.7 nm to about 2.3 nm or about 3.0 nm to about 3.7 nm to result in an antiferromagnetic coupling between first spacer layer 608 and the adjacent upper free layer structure. In some other embodiments, the two ranges can instead be about 0.7 nm to about 1.0 nm or about or about 3.0 nm to about 3.7 nm.

In some embodiments, a second spacer layer 610 has a thickness that can be in one of two example ranges, e.g., about 1.0 nm to about 1.7 nm or about 2.3 nm to about 3.0 nm to result in a ferromagnetic coupling between second spacer layer 610 and the adjacent lower free layer structure.

Thus, it will be appreciated that the two free layer structures have magnetic fields with nominal directions pointing in opposing directions. In addition, by selection of thickness of first and second spacer layers 608, 610, the two couplings, ferromagnetic and antiferromagnetic, can have about the same magnitude, but in opposite directions.

It should be further appreciated that operation of the dual spin valve magnetoresistance element 600 operates very much like a series stack combination of the magnetoresistance elements (e.g., a stack having a double pinned magnetoresistance element portion 602 and a reversed double pinned magnetoresistance element portion 604), where two resulting spacer layers 608, 610 have selected thickness to result in a ferromagnetic coupling to the lower free layer structure and an antiferromagnetic coupling to the upper free layer structure.

In some alternate embodiments, first spacer layer 608 can have the same thickness as second spacer layer 610 and vice versa. The dual spin valve magnetoresistance element 600 can have two synthetic antiferromagnetic (SAF) pinned structures and also two other pinned layers (i.e., single layer pinned layers). The two synthetic antiferromagnetic (SAF) pinned structures and also the two other pinned layers are both referred to herein as pinned layer structures.

It will be appreciated that various properties of the element stacks can be varied to vary the resulting sensitivity. As one example, a double deposition can be used to produce two different stacks having different sensitivities.

Figure 6A:
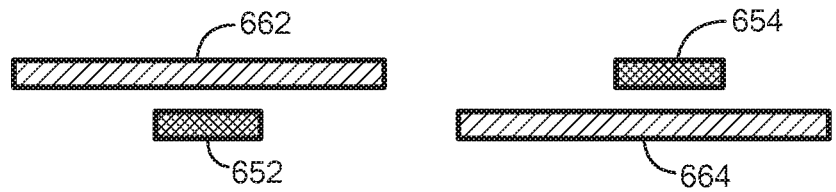
FIG. 6A illustrates the first and second sensor arrangements of FIG. 1 having a shield layer.

Now referring to FIG. 6A, a first sensor arrangement 652 and a second sensor arrangement 654 are provided, each having a shield layer 662, 664, respectively. First and second sensor arrangements 652, 654 may be the same as or substantially similar to first and second sensor arrangements 102, 104 of FIG. 1. First sensor arrangement 652 includes a first shield layer 662 disposed adjacent to a first surface (here a top surface) of first sensor arrangement 652 and second sensor arrangement 654 includes a second shield layer 664 disposed adjacent to a second surface (here a bottom surface) of second sensor arrangement 654.

Although FIG. 6A shows a shield layer disposed adjacent to at least one surface of each of first and second sensor arrangements 652, 654, it should be appreciated that shield layers can be formed adjacent to or on any surface of first and second sensor arrangements 652, 654. For example, shielding layers 662, 664 can be provided adjacent to a top surface, bottom surface, side surface or any combination of the top surface, bottom surface, and/or side surface of a particular sensor arrangement. In some embodiments, one of first and second sensor arrangements 652, 654 may include a shield layer and the other of first and second sensor arrangements 652, 654 may not include a shield layer.

The shielding property can be different between first and second sensor arrangements 652, 654. For example, first and second shield layers 662, 664 can be provided by a soft magnetic material. The first and second shield layers 662, 664 can have different properties and/or dimensions (e.g., thickness) and/or position relative to the respective sensor arrangement to provide different sensitivities and measurement ranges for the respective sensor arrangement. In such an embodiment, first sensor arrangement 652 and second sensor arrangement 654 can differ from each other in a sensitivity attributable to their respective shield layers 662, 664.

Figure 7:
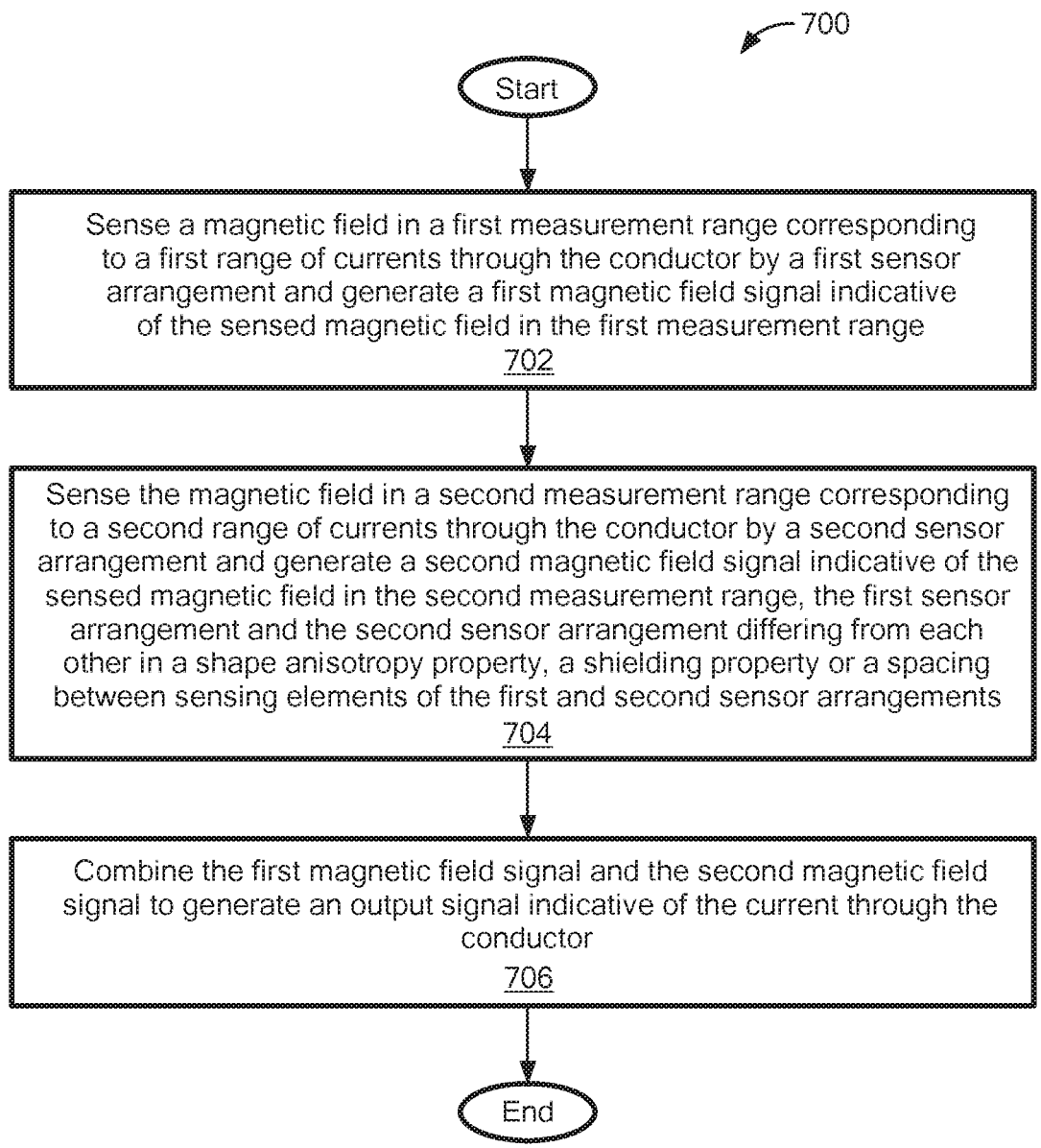
FIG. 7 shows a flow diagram of a method for sensing a magnetic field generated by a current through a conductor.

Now referring to FIG. 7, a method 700 for sensing a magnetic field generated by a current through a conductor is illustrated. Method 700 begins at block 702, by sensing a magnetic field in a first measurement range corresponding to a first range of currents through the conductor by a first sensor arrangement and generating a first magnetic field signal indicative of the sensed magnetic field in the first measurement range.

At block 704, a magnetic field can be sensed in a second measurement range corresponding to a second range of currents through the conductor by a second sensor arrangement and generating the second magnetic field signal indicative of the sensed magnetic field in the second measurement range. In an embodiment, the first magnetic field signal can be different from the second magnetic field signal and the first range of currents can be different (e.g., less than, greater than) the second range of currents.

The different sensor arrangements can be configured to sense the magnetic field in different measurement ranges, with the different measurement ranges corresponding to different ranges of current through the conductor. For example, in one embodiment, a first sensor arrangement can be configured to sense the magnetic field in the first measurement range, with the first measurement range corresponding to a higher current range and a second sensor arrangement can be configured to sense the magnetic field in a second measurement range, with the second measurement range corresponding to a lower current range.

Each of the different sensor arrangements (e.g., bridge configurations) can generate a magnetic field signal (e.g., analog output) indicative of the sensed magnetic field in the respective measurement range. To generate different magnetic field signals, the first sensor arrangement and the second sensor arrangement can have different properties, such as but not limited to, a shape anisotropy property, a shielding property, a spacing between magnetic field sensing elements of the first and second sensor arrangements, and/or a stack property. For example, the first sensor arrangement and the second sensor arrangement differ from each other in a shape anisotropy property, such as but not limited to, having different widths, thicknesses or shapes. In some embodiments, one or more magnetic field sensing elements of the first sensor arrangement can have a first width and one or more magnetic field sensing elements of the second sensor arrangement can have a second width, different (e.g., less than, greater than) than the first width.

The magnetic field sensing elements of the first and/or second sensor arrangement can be formed in a variety of different shapes, such as a yoke shape.

The first sensor arrangement can include a first plurality of magnetic field sensing elements arranged in a first bridge configuration and the second sensor arrangement can include a second plurality of magnetic field sensing elements arranged in a second bridge configuration. The spacing between the magnetic field sensing elements of each bridge configuration can be different to provide the sensor arrangements with different measurement ranges. For example, a spacing between the first plurality of magnetic field sensing element may be different than a spacing between the second plurality of magnetic field sensing elements. In some embodiments, the first plurality of magnetic field sensing elements of the first bridge and the second plurality of magnetic field sensing elements of the second bridge can be substantially equidistant from the edge. In other embodiments, the first plurality of magnetic field sensing elements of the first bridge can be disposed at a first distance from the edge and the second plurality of magnetic field sensing elements of the second bridge can be disposed at a second distance from the edge that is different (e.g., greater than, less than) than the first distance.

In some embodiments, a shielding property can be different between the first and second sensor arrangements. For example, a shield layer of a soft magnetic material can be formed in at least one of the first sensor arrangement or the second sensor arrangement such that the first sensor arrangement and the second sensor arrangement differ from each other in a sensitivity attributable to the shield layer. In one embodiment, each of the first and second sensor arrangements can include a shield layer, however the shield layers can have different properties to provide different sensitivities and measurement ranges for the respective sensor arrangement.

At block 706, the first magnetic field signal and the second magnetic field signal can be combined to generate an output signal indicative of the current through the conductor. The output of second sensor arrangement (e.g., low current bridge) can saturate for current higher than the targeted measurement range for the second sensor arrangement. In some embodiments, the circuitry of the current sensor (e.g., front end amplifiers) can be configured to compensate for the different sensor arrangement (e.g., different bridge) sensitivities such that the different sensor arrangements can have the same or substantially similar output levels for the same current.

To combine the first and second magnetic field signals, a saturation coefficient can be generated using the output of at least one of the first or second sensor arrangements. For example, the saturation coefficient (D(t)) can be determined using the following formula.

$$D(t) = \exp\left(\frac{BridgeOutput_{LC}(t)}{I_{mean}} - 1\right)^{12}$$

Where $BridgeOutput_{LC}$ is the output value of the low current bridge and $I_{mean}$ is a fixed coefficient selected to be above the detection limit of the high current bridge and low enough to limit the consumption of the low current closed-loop. In some embodiments, the low current bridge can be the second sensor arrangement and thus the second magnetic field signal generated by the second sensor arrangement can be used to generate the saturation coefficient. In other embodiments, the low current bridge can be the first sensor arrangement and thus the first magnetic field signal generated by the first sensor arrangement can be used to generate the saturation coefficient.

The value of the saturation coefficient can vary between two saturation coefficients (e.g., 0 and 1) and the saturation coefficients can be determined based at least in part on a particular application of the current sensor and one or more current ranges to be measured. In an embodiment, the saturation coefficient can be configured to cancel the high current bridge output and to prevent the injection of noise when measuring low currents.

A complement saturation coefficient can be generated by taking the complement version of the saturation coefficient (e.g., 1−D(t)). In an embodiment, the saturation coefficient can be applied to the first magnetic field signal to generate a first current range signal and the complement version of the saturation coefficient can be applied to the second magnetic field signal to generate a second current range signal.

The first current range signal and the second current range signal can be combined to generate the output signal corresponding to the current carried by the conductor. In some embodiments, the output signal ($V_{out}(t)$) can be determined using the following formula:

$$V_{out}(t) = D(t)*BridgeOutput_{HC}(t) + (1-D(t))*BridgeOutput_{LC}(t)$$

Where D(t) is the saturation coefficient, $BridgeOutput_{HC}$ is the output value of the high current bridge (e.g., first magnetic field signal from the first sensor arrangement), and $BridgeOutput_{LC}$ is the output value of the low current bridge (e.g., second magnetic field signal of the second sensor arrangement). The output signal corresponds to the current through the conductor using two or more measurement ranges.

It will be appreciated that the operations described in connection with blocks 702, 704, and 706 may be performed simultaneously or substantially simultaneously.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A current sensor for sensing a magnetic field generated by a current through a conductor comprising:
   a first sensor arrangement comprising one or more magnetic field sensing elements, the first sensor arrangement configured to sense a magnetic field in a first measurement range corresponding to a first range of currents through the conductor and further configured to generate a first magnetic field signal indicative of the sensed magnetic field in the first measurement range;
   a second sensor arrangement comprising one or more magnetic field sensing elements, the second sensor arrangement configured to sense the magnetic field in a second measurement range corresponding to a second range of currents through the conductor and further configured to generate a second magnetic field signal indicative of the sensed magnetic field in the second measurement range, and wherein the first sensor arrangement and the second sensor arrangement differ from each other in one or more of a shape anisotropy property, a shielding property, a spacing between magnetic field sensing elements of the first and second sensor arrangements, and/or a stack property; and
   a circuit responsive to the first magnetic field signal and to the second magnetic field signal and configured to generate an output signal indicative of a combination of the first magnetic field signal and the second magnetic field signal, wherein the output signal corresponds to the current through the conductor, wherein the circuit comprises:
      a first unit to combine the first magnetic field signal with a saturation coefficient to generate a first current range signal;
      a second unit to combine the second magnetic field signal with a complement version of the saturation coefficient to generate a second current range signal; and
      a third unit to combine the first current range signal and the second current range signal to generate the output signal corresponding to the current through the conductor.

2. The current sensor of claim 1, wherein the first sensor arrangement comprises a first plurality of magnetic field sensing elements arranged in a first bridge and the second sensor arrangement comprises a second plurality of magnetic field sensing elements arranged in a second bridge.

3. The current sensor of claim 2, wherein a spacing between the first plurality of magnetic field sensing elements of the first bridge is different than a spacing between the second plurality of magnetic field sensing elements of the second bridge.

4. The current sensor of claim 2, wherein the conductor has an edge and wherein each of the first plurality of magnetic field sensing elements of the first bridge is substantially equidistant from the edge and wherein each of the second plurality of magnetic field sensing elements of the second bridge is substantially equidistant from the edge.

5. The current sensor of claim 4, wherein the conductor has an edge and each of the first plurality of magnetic field sensing elements of the first bridge is disposed at a first distance from the edge and each of the second plurality of magnetic field sensing elements of the second bridge is disposed at a second distance from the edge, wherein the second distance is greater than the first distance.

6. The current sensor of claim 1, wherein at least one of the first sensor arrangement or the second sensor arrangement further comprises a shield layer made with soft magnetic material so that the field experienced by the at least one of the first sensor arrangement or the second sensor arrangement is reduced by a factor attributable to the shield layer.

7. The current sensor of claim 1, wherein the first sensor arrangement and the second sensor arrangement differ from each other in a shape anisotropy property, wherein at least one magnetic field sensing element of the first sensor arrangement has a first width and at least one magnetic field sensing element of the second sensor arrangement has a second width different than the first width.

8. The current sensor of claim 7, wherein the first range of currents sensed is less than the second range of currents sensed and wherein the first width is greater than the second width.

9. The current sensor of claim 1, wherein the first sensor arrangement has a first saturation threshold and the second sensor arrangement has a second saturation threshold.

10. The current sensor of claim 1, wherein:
    the first unit is configured to multiply the first magnetic field signal by the saturation coefficient to generate the first current range signal;
    the second unit is configured to multiply the second magnetic field signal by the complement version of the saturation coefficient to generate the second current range signal; and
    the third unit is configured to add the first current range signal and the second current range signal to generate the output signal corresponding to the current through the conductor.

11. The current sensor of claim 1, wherein the one or more magnetic field sensing elements of the first sensor arrangement and the one or more magnetic field sensing elements of the second sensor arrangement comprise one or more of magnetoresistance elements.

12. The current sensor of claim 11, wherein the one or more magnetoresistance elements comprise at least one of a giant magnetoresistance (GMR) element, an anisotropic magnetoresistance (AMR) element, a tunneling magnetoresistance (TMR) element or a magnetic tunnel junction (MTJ) element.

13. A method for sensing a magnetic field generated by a current through a conductor, the method comprising:
    sensing a magnetic field in a first measurement range corresponding to a first range of currents through the conductor by a first sensor arrangement and generating a first magnetic field signal indicative of the sensed magnetic field in the first measurement range;
    sensing the magnetic field in a second measurement range corresponding to a second range of currents through the conductor by a second sensor arrangement and generating a second magnetic field signal indicative of the sensed magnetic field in the second measurement range, wherein the first sensor arrangement and the second sensor arrangement differ from each other in one or more of a shape anisotropy property, a shielding property, a spacing between magnetic field sensing elements of the first and second sensor arrangements, or a stack property; and combining the first magnetic field signal and the second magnetic field signal to generate an output signal indicative of the current through the conductor, wherein combining comprises:

applying a saturation coefficient to the first magnetic field signal to generate a first current range signal;

applying a complement version of the saturation coefficient to the second magnetic field signal to generate a second current range signal; and combining the first current range signal and the second current range signal to generate the output signal corresponding to the current carried by the conductor.

14. The method of claim 13, wherein:

applying the saturation coefficient to the first magnetic field signal to generate a first current range signal comprises multiplying the first magnetic field signal by the saturation coefficient;

applying the complement version of the saturation coefficient to the second magnetic field signal to generate a second current range signal comprises multiplying the second magnetic field signal by the complement version of the saturation coefficient; and combining the first current range signal and the second current range signal to generate the output signal corresponding to the current carried by the conductor comprises adding the first current range signal and the second current range signal.

15. The method of claim 13, wherein the first sensor arrangement comprises a first plurality of magnetic field sensing elements arranged in a first bridge and the second sensor arrangement comprises a second plurality of magnetic field sensing elements arranged in a second bridge.

16. The method of claim 15, wherein a spacing between the first plurality of magnetic field sensing elements is different than a spacing between the second plurality of magnetic field sensing elements.

17. The method of claim 15, wherein the conductor has an edge and wherein each of the first plurality of magnetic field sensing elements of the first bridge is substantially equidistant from the edge and wherein each of the second plurality of magnetic field sensing elements of the second bridge is substantially equidistant from the edge.

18. The method of claim 15, wherein the conductor has an edge and wherein each of the first plurality of magnetic field sensing elements of the first bridge is disposed at a first distance from the edge and each of the second plurality of magnetic field sensing elements of the second bridge is disposed at a second distance from the edge, wherein the second distance is greater than the first distance.

19. The method of claim 13, further comprising forming a shield layer of a soft magnetic material in at least one of the first sensor arrangement or the second sensor arrangement such that the first sensor arrangement and the second sensor arrangement differ from each other in a sensitivity attributable to the shield layer, wherein the shield layer includes a soft magnetic material so that the field experienced by the first sensor arrangement or the second sensor arrangement is reduced by a factor attributable to the shield layer.

20. The method of claim 13, wherein the first sensor arrangement and the second sensor arrangement differ from each other in a shape anisotropy property, wherein at least one magnetic field sensing element of the first sensor arrangement has a first width and at least one magnetic field sensing element of the second sensor arrangement has a second width different than the first width.

21. The method of claim 20, wherein the first range of currents sensed is less than the second range of currents sensed and wherein the first width is greater than the second width.

22. A current sensor for sensing a magnetic field generated by a current through a conductor comprising:

first sensing means comprising one or more magnetic field sensing means and configured to sense a magnetic field in a first measurement range corresponding to a first range of currents through the conductor, wherein the first sensing means is configured to generate a first magnetic field signal indicative of the sensed magnetic field in the first measurement range;

second sensing means comprising one or more magnetic field sensing means and configured to sense the magnetic field in a second measurement range corresponding to a second range of currents through the conductor, wherein the second sensing means is configured to generate a second magnetic field signal indicative of the sensed magnetic field in the second measurement range, and wherein the first sensor arrangement and the second sensor arrangement differ from each other in one or more of a shape anisotropy property, a shielding property, a spacing between magnetic field sensing elements of the first and second sensor arrangements, or a stack property; and means for generating an output signal responsive to the first magnetic field signal and to the second magnetic field signal, wherein the output signal is indicative of a combination of the first magnetic field signal and the second magnetic field signal, and wherein the output signal corresponds to the current carried by the conductor, the means for generating further comprising:

first combining means coupled to combine the first magnetic field signal and a saturation coefficient to generate a first current range signal;

second combining means coupled to combine the second magnetic field signal and a complement version of the saturation coefficient to generate a second current range signal; and third combining means coupled to combine the first current range signal and the second current range signal to generate the output signal corresponds to the current carried by the conductor.

23. The current sensor of claim 22, wherein the first sensing means comprises a first plurality of magnetic field sensing elements arranged in a first bridge and the second sensing means comprises a second plurality of magnetic field sensing elements arranged in a second bridge.

24. The current sensor of claim 23, wherein the spacing between the first plurality of magnetic field sensing elements is different than the spacing between the second plurality of magnetic field sensing elements.

25. The current sensor of claim 24, wherein the conductor has an edge and wherein each of the first plurality of magnetic field sensing elements of the first bridge is substantially equidistant from the edge and wherein each of the second plurality of magnetic field sensing elements of the second bridge is substantially equidistant from the edge.

26. The current sensor of claim 25, wherein the conductor has an edge and wherein each of the first plurality of magnetic field sensing elements of the first bridge is disposed at a first distance from the edge and wherein each of the second plurality of magnetic field sensing elements of the second bridge is disposed at a second distance from the edge, wherein the second distance is greater than the first distance.

27. The current sensor of claim 22, wherein at least one of the first sensing means or the second sensing means comprises a shield layer of a soft magnetic material so that the field experienced by the at least one of the first sensing means or the second sensing means is reduced by a factor attributable to the shield layer.

28. The current sensor of claim 22, wherein the first sensing means and the second sensing means differ from each other in a shape anisotropy property, wherein at least one magnetic field sensing element of the first sensing means has a first width and at least one magnetic field sensing element of the second sensing means has a second width different than the first width.

29. The current sensor of claim 28, wherein the first range of currents sensed is less than the second range of currents sensed and wherein the first width is greater than the second width.

30. The current sensor of claim 22, wherein:
the first combining means is configured to multiply the first magnetic field signal and the saturation coefficient to generate the first current range signal;
the second combining means is configured to multiply the second magnetic field signal and the complement version of the saturation coefficient to generate the second current range signal; and
the third combining means is configured to add the first current range signal and the second current range signal to generate the output signal corresponds to the current carried by the conductor.

* * * * *

UNITED STATES PATENT AND TRADEMARK OFFICE
CERTIFICATE OF CORRECTION

PATENT NO. : 10,935,612 B2
APPLICATION NO. : 15/999448
DATED : March 2, 2021
INVENTOR(S) : Noémie Belin et al.

It is certified that error appears in the above-identified patent and that said Letters Patent is hereby corrected as shown below:

In the Specification

Column 4, Line 8 delete "105 having two" and replace with --two--.

Column 4, Lines 44-45 delete "arrangements" and replace with --arrangement--.

Column 4, Lines 47-48 delete "arrangements" and replace with --arrangement--.

Column 5, Line 1 delete "though" and replace with --through--.

Column 5, Line 25 delete "though" and replace with --through--.

Column 10, Line 55 delete "$402c, 402d$" and replace with --$404c, 404d$--.

Column 12, Line 3 delete "thresholds" and replace with --threshold--.

Column 12, Line 57 delete "(D(t)" and replace with --D(t)--.

Column 14, Line 51 delete "position" and replace with --positions--.

Column 16, Lines 62-63 delete "$Output_L C(t)$" and replace with --$Output_{LC}(t)$--.

In the Claims

Column 20, Line 51 delete "corresponds" and replace with --corresponding--.

Column 22, Line 17 delete "corresponds" and replace with --corresponding--.

Signed and Sealed this
Nineteenth Day of April, 2022

Katherine Kelly Vidal
*Director of the United States Patent and Trademark Office*